US012740287B2

(12) United States Patent
Wang et al.

(10) Patent No.: US 12,740,287 B2
(45) Date of Patent: Sep. 15, 2026

(54) ELECTRONIC SUBSTRATE AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Wang, Beijing (CN); Yi Zhang, Beijing (CN); Peng Xu, Beijing (CN); Chang Luo, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 507 days.

(21) Appl. No.: 18/256,843

(22) PCT Filed: Nov. 24, 2021

(86) PCT No.: PCT/CN2021/132685
§ 371 (c)(1),
(2) Date: Jun. 9, 2023

(87) PCT Pub. No.: WO2023/092317
PCT Pub. Date: Jun. 1, 2023

(65) Prior Publication Data

US 2024/0023407 A1 Jan. 18, 2024

(51) Int. Cl.
*G06F 3/041* (2006.01)
*H10K 59/82* (2023.01)
(Continued)

(52) U.S. Cl.
CPC .......... *H10K 59/82* (2023.02); *G06F 3/0412* (2013.01); *G06F 3/0446* (2019.05); *H10K 59/40* (2023.02)

(58) Field of Classification Search
None
See application file for complete search history.

(56) References Cited

U.S. PATENT DOCUMENTS

2010/0013743 A1 1/2010 Cho et al.
2017/0237027 A1 8/2017 Lee et al.
(Continued)

FOREIGN PATENT DOCUMENTS

CN 203299792 U 11/2013
CN 108646477 A 10/2018
(Continued)

*Primary Examiner* — Brian M Butcher
(74) *Attorney, Agent, or Firm* — LEASON ELLIS LLP

(57) ABSTRACT

An electronic substrate and an electronic device are provided. The electronic substrate includes a base substrate, and a first signal line and a second signal line on the base substrate; the electronic substrate includes a first functional region and a peripheral region, and the first signal line and the second signal line are in the peripheral region; at least one of the first signal line and the second signal line is configured to transmit an electrical signal for the first functional region; in a direction perpendicular to the base substrate, the first signal line partially overlaps with the second signal line in an overlapping region; and the first signal line includes a first wiring portion in the overlapping region and a second wiring portion outside the overlapping region, and a line width of the first wiring portion is different from a line width of the second wiring portion.

19 Claims, 9 Drawing Sheets

(51) Int. Cl.

| | |
|---|---|
| *G06F 3/044* | (2006.01) |
| *H10K 59/40* | (2023.01) |

(56) References Cited

U.S. PATENT DOCUMENTS

| | | | |
|---|---|---|---|
| 2019/0304999 A1 | 10/2019 | Wang et al. | |
| 2021/0193698 A1* | 6/2021 | Park ..................... | H10K 59/131 |
| 2022/0069052 A1 | 3/2022 | Liu et al. | |
| 2022/0271113 A1 | 8/2022 | Zhou et al. | |
| 2022/0320236 A1 | 10/2022 | Dai et al. | |

FOREIGN PATENT DOCUMENTS

| | | |
|---|---|---|
| CN | 108984023 A | 12/2018 |
| CN | 109524445 A | 3/2019 |
| CN | 111816118 A | 10/2020 |
| CN | 113410277 A | 9/2021 |
| CN | 113498534 A | 10/2021 |
| CN | 113552970 A | 10/2021 |
| CN | 113594204 A | 11/2021 |
| JP | 6793323 B2 | 12/2020 |
| WO | 2012118613 A1 | 9/2012 |
| WO | 2021189334 A1 | 9/2021 |

* cited by examiner

ELECTRONIC SUBSTRATE AND ELECTRONIC DEVICE

CROSS-REFERENCE TO RELATED PATENT APPLICATIONS

This application is a U.S. National Stage Application under 35 U.S.C. § 371 of International Patent Application No. PCT/CN2021/132685, filed Nov. 24, 2021, which is incorporated by reference in its entirety. The International Application was published on Jun. 1, 2023, and received publication no. WO2023/092317 A1.

TECHNICAL FIELD

Embodiments of the present disclosure relate to an electronic substrate and an electronic device.

BACKGROUND

User interfaces with a touch function have been widely used in various electronic devices, such as display panels, display devices or other display products. Meanwhile, with the increasing demand of users for the visual effect of display products, the narrow frame or even full-screen display has become a new trend in the development of display products such as organic light-emitting diode (OLED) display products.

SUMMARY

At least an embodiment of the present disclosure provides an electronic substrate, and the electronic substrate comprises a base substrate, and at least one first signal line and at least one second signal line on the base substrate; the electronic substrate comprises a first functional region and a peripheral region at least partially surrounding the first functional region, and the first signal line and the second signal line are in the peripheral region and at least partially surround the first functional region; the first signal line and the second signal line are spaced apart from each other and insulated from each other; at least one of the first signal line and the second signal line is configured to transmit an electrical signal for the first functional region; in a direction perpendicular to the base substrate, the first signal line partially overlaps with the second signal line in an overlapping region; and the first signal line comprises a first wiring portion in the overlapping region and a second wiring portion outside the overlapping region, the second signal line comprises a third wiring portion in the overlapping region and a fourth wiring portion outside the overlapping region, and a line width of the first wiring portion is different from a line width of the second wiring portion.

For example, in the electronic substrate provided by an embodiment of the present disclosure, a line width of a portion of the first wiring portion overlapping with the second signal line in the direction perpendicular to the base substrate is smaller than the line width of the second wiring portion.

For example, in the electronic substrate provided by an embodiment of the present disclosure, a line width of a portion of the first wiring portion not overlapping with the second signal line in the direction perpendicular to the base substrate is smaller than the line width of the second wiring portion.

For example, in the electronic substrate provided by an embodiment of the present disclosure, an average line width of the first wiring portion is smaller than an average line width of the second wiring portion.

For example, in the electronic substrate provided by an embodiment of the present disclosure, a line width of the third wiring portion is different from a line width of the fourth wiring portion.

For example, in the electronic substrate provided by an embodiment of the present disclosure, a line width of a portion of the third wiring portion overlapping with the first signal line in the direction perpendicular to the base substrate is smaller than the line width of the fourth wiring portion.

For example, in the electronic substrate provided by an embodiment of the present disclosure, a line width of a portion of the third wiring portion not overlapping with the first signal line in the direction perpendicular to the base substrate is smaller than the line width of the fourth wiring portion.

For example, in the electronic substrate provided by an embodiment of the present disclosure, an average line width of the third wiring portion is smaller than an average line width of the fourth wiring portion.

For example, in the electronic substrate provided by an embodiment of the present disclosure, an extending direction of an orthographic projection of the first wiring portion on the base substrate is substantially perpendicular to an extending direction of an orthographic projection of the third wiring portion on the base substrate.

For example, in the electronic substrate provided by an embodiment of the present disclosure, the second wiring portion and the fourth wiring portion are arranged side by side with each other in a plane parallel to the base substrate, and an extending direction of an orthographic projection of the second wiring portion on the base substrate is substantially parallel to an extending direction of an orthographic projection of the fourth wiring portion on the base substrate.

For example, in the electronic substrate provided by an embodiment of the present disclosure, an extending direction of an orthographic projection of the first wiring portion on the base substrate is substantially parallel to an extending direction of an orthographic projection of the second wiring portion on the base substrate, and the orthographic projection of the first wiring portion on the base substrate and the orthographic projection of the second wiring portion on the base substrate are substantially in one straight line.

For example, the electronic substrate provided by an embodiment of the present disclosure further comprises a first conductive layer, an insulating layer, and a second conductive layer; the first conductive layer, the insulating layer, and the second conductive layer are on the base substrate and are stacked with each other; the insulating layer is between the first conductive layer and the second conductive layer, and the first conductive layer and the second conductive layer are spaced apart and insulated from each other in the direction perpendicular to the base substrate by the insulating layer; the first wiring portion is in the first conductive layer; and the second wiring portion comprises a first sub-portion in the first conductive layer and a second sub-portion in the second conductive layer, and the first sub-portion of the second wiring portion is electrically connected to the second sub-portion of the second wiring portion through a via hole structure at least penetrating the insulating layer.

For example, in the electronic substrate provided by an embodiment of the present disclosure, the third wiring portion is in the second conductive layer; and the fourth wiring portion comprises a first sub-portion in the first conductive layer and a second sub-portion in the second conductive layer, and the first sub-portion of the fourth wiring portion is electrically connected to the second sub-portion of the fourth wiring portion through a via hole structure at least penetrating the insulating layer.

For example, in the electronic substrate provided by an embodiment of the present disclosure, the at least one first signal line comprises a plurality of first signal lines, and the plurality of first signal lines are arranged side by side with each other in a plane parallel to the base substrate; and among the plurality of first signal lines, a distance between first wiring portions of two adjacent first signal lines is greater than a distance between second wiring portions of the two adjacent first signal lines.

For example, in the electronic substrate provided by an embodiment of the present disclosure, the plurality of first signal lines are sequentially arranged along a direction away from the first functional region; and among the plurality of first signal lines, via hole structures in the first signal lines for connecting the first sub-portion and the second sub-portion are staggered with each other in the direction away from the first functional region.

For example, the electronic substrate provided by an embodiment of the present disclosure further comprises at least one third signal line on the base substrate; the third signal line is in the peripheral region and at least partially surrounds the first functional region, and the third signal line is spaced apart and insulated from the first signal line and the second signal line, respectively; in the direction perpendicular to the base substrate, the third signal line partially overlaps with the second signal line in the overlapping region; the third signal line comprises a fifth wiring portion in the overlapping region and a sixth wiring portion outside the overlapping region; the fifth wiring portion is in the first conductive layer; and the sixth wiring portion comprises a first sub-portion in the first conductive layer and a second sub-portion in the second conductive layer, and the first sub-portion of the sixth wiring portion is electrically connected to the second sub-portion of the sixth wiring portion through a via hole structure at least penetrating the insulating layer.

For example, in the electronic substrate provided by an embodiment of the present disclosure, the third signal line and the at least one first signal line are arranged side by side with each other in a plane parallel to the base substrate, and an extending direction of an orthographic projection of the third signal line on the base substrate is substantially parallel to an extending direction of an orthographic projection of the first signal line on the base substrate.

For example, in the electronic substrate provided by an embodiment of the present disclosure, a line width of the fifth wiring portion is different from a line width of the sixth wiring portion.

For example, in the electronic substrate provided by an embodiment of the present disclosure, an extending direction of an orthographic projection of the fifth wiring portion on the base substrate is substantially perpendicular to an extending direction of an orthographic projection of the third wiring portion on the base substrate.

For example, in the electronic substrate provided by an embodiment of the present disclosure, the third signal line further comprises a seventh wiring portion in the overlapping region; the seventh wiring portion is in the second conductive layer and is connected to the second sub-portion of the sixth wiring portion; and in the direction perpendicular to the base substrate, the seventh wiring portion partially overlaps with the first signal line in the overlapping region.

For example, in the electronic substrate provided by an embodiment of the present disclosure, an extending direction of an orthographic projection of the seventh wiring portion on the base substrate is substantially perpendicular to an extending direction of an orthographic projection of the first wiring portion on the base substrate.

For example, the electronic substrate provided by an embodiment of the present disclosure further comprises at least one fourth signal line on the base substrate; the fourth signal line is in the peripheral region and at least partially surrounds the first functional region, and the fourth signal line is spaced apart and insulated from the first signal line and the second signal line, respectively; in the direction perpendicular to the base substrate, the fourth signal line partially overlaps with the second signal line in the overlapping region; and the fourth signal line is on a side of the first signal line close to the first functional region, and a line width of the fourth signal line is smaller than or equal to the line width of the second wiring portion.

For example, the electronic substrate provided by an embodiment of the present disclosure further comprises at least one fifth signal line on the base substrate; the fifth signal line is in the peripheral region and at least partially surrounds the first functional region, and the fifth signal line is spaced apart and insulated from the first signal line and the second signal line, respectively; and the fifth signal line is on a side of the first signal line and the second signal line away from the first functional region, and is configured to transmit an electrical signal for the peripheral region.

For example, the electronic substrate provided by an embodiment of the present disclosure further comprises at least one sixth signal line on the base substrate, the sixth signal line is in the peripheral region and at least partially surrounds the first functional region, the sixth signal line is spaced apart and insulated from the first signal line and the second signal line, respectively, and the sixth signal line is configured to be floating.

For example, in the electronic substrate provided by an embodiment of the present disclosure, a line width of a second wiring portion in the first signal line close to the first functional region is smaller than or equal to a line width of a second wiring portion in the first signal line away from the first functional region; and a line width of a fourth wiring portion in the second signal line close to the first functional region is smaller than or equal to a line width of a fourth wiring portion in the second signal line away from the first functional region.

For example, in the electronic substrate provided by an embodiment of the present disclosure, the first functional region comprises an opening, and the peripheral region comprises an opening peripheral region in the opening; the first signal line and the second signal line are in the opening peripheral region and arranged along an edge of the opening peripheral region; and the first signal line and the second signal line are configured to transmit an electrical signal for the first functional region.

At least an embodiment of the present disclosure further provides an electronic device, the electronic device comprises the electronic substrate according to any one of the embodiments of the present disclosure, and the electronic substrate is configured to have a touch function and/or a display function.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1:
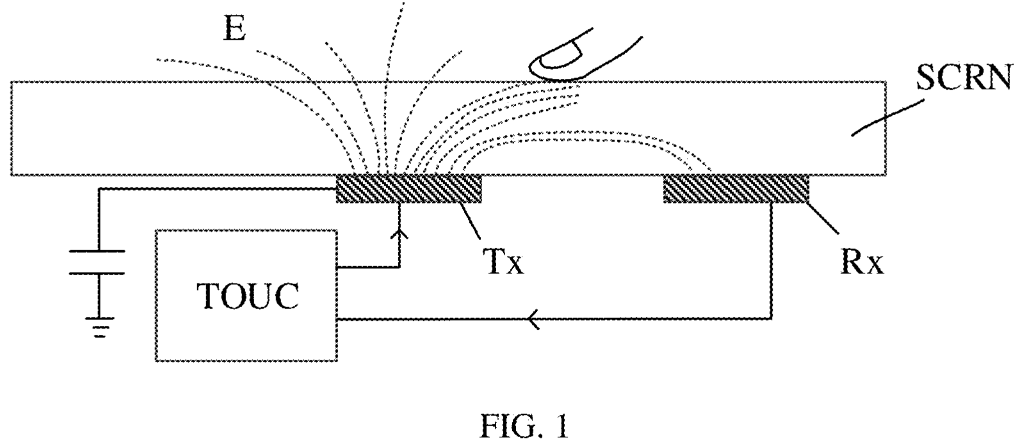
FIG. 1 is a schematic diagram of the working principle of a mutual capacitance touch control structure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not limited to a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

Organic light-emitting diode (OLED) display products have characteristics of self-illumination, high contrast, low energy consumption, wide viewing angle, fast response, capability of being applied for flexible panels, wide operating temperature range, simple manufacturing, or the like, and therefore have broad development prospects. In order to meet the diverse use needs of users, it may be necessary to integrate various functions in display products, such as a touch control function, a fingerprint recognition function, or the like. For example, in the OLED display products, the touch control function may be implemented in the OLED display products by forming an on-cell touch control structure or an in-cell touch control structure.

For example, taking a mutual capacitance touch control structure as an example, the mutual capacitance touch control structure includes a plurality of touch control electrodes, the plurality of touch control electrodes include touch control driving electrodes Tx and touch control sensing electrodes Rx extending in different directions, and the touch control driving electrode Tx and the touch control sensing electrode Rx form a mutual capacitance for touch control sensing at the location where they cross each other. The touch control driving electrode Tx is configured for inputting an excitation signal (e.g., a touch control driving signal), and the touch control sensing electrode Rx is configured for outputting a touch control sensing signal. By inputting the excitation signal to, for example, the touch control driving electrode vertically extending, and receiving the touch control sensing signal from, for example, the touch control sensing electrode horizontally extending, a detection signal reflecting the capacitance value of the coupling position (e.g., intersection) of the horizontal and vertical electrodes can be obtained. When a finger touches a touch screen (such as a cover glass), the coupling between the touch control driving electrode Tx and the touch control sensing electrode Rx near the touch point is affected, thus changing the capacitance value of mutual capacitance at the intersection of the two electrodes and resulting in a change in the output touch control sensing signal, so that the corresponding coordinates of the touch point can be calculated according to the amount of data change of the touch control sensing signal.

FIG. 1 is a schematic diagram of the working principle of a mutual capacitance touch control structure. As illustrated in FIG. 1, under the drive of the touch control driving circuit TOUC, the touch control driving electrode Tx is applied with a touch control driving signal, thus generating electric field lines E, which are received by the touch control sensing electrode Rx to form a reference capacitance. When a finger touches the touch screen SCRN, because the human body is a conductor, a part of the electric field lines E generated by the touch control driving electrode Tx are guided to the finger to form a finger capacitance, which reduces the electric field lines E received by the touch control sensing electrode Rx, so that the capacitance value between the touch control driving electrode Tx and the touch control sensing electrode Rx decreases. The touch control driving circuit TOUC obtains the above-mentioned capacitance value through the touch control sensing electrode Rx, and compares the obtained capacitance value with the reference capacitance to obtain the change amount of capacitance value. The corresponding coordinate of the touch point can be calculated according to data of the change amount of capacitance value and the position coordinate of each touch control capacitance.

With the wide application of display products, demands of users for display products, such as functions and appearance, are further improved. In order to meet different actual needs of users, the appearance or functional region of the display product sometimes needs to be designed into irregular or special shapes. For example, the display region of the display product is designed to have an irregular shape with an opening or a notch in which a device such as a camera, a distance sensor, or the like may be arranged, that is, the device is exposed through the opening or notch so that it can receive external light, which is beneficial to achieving the narrow frame design of the display product.

For the above-mentioned display product with an irregular or special shape, because the opening or notch occupies a part of the display region, it is difficult for the touch control structure, which is used for implementing the touch control function, to be evenly distributed in the display region. For example, the transmission of such as a touch control signal or a display signal usually needs to be achieved through corresponding connection lines provided in the frame region surrounding the opening or the notch. For example, taking the mutual capacitance touch control structure as an example, in the frame region surrounding the opening or the notch, it is necessary to provide a driving connection wire for connecting the touch control driving electrode Tx and a sensing connection wire for connecting the touch control sensing electrode Rx.

Meanwhile, in order to avoid adverse effects on various functional layers of such as a display device in the display region, two cofferdam structures with different heights are usually provided in the frame region, and organic film layers between the two cofferdam structures, such as a pixel defining layer and a planarization layer, are removed as much as possible to form a "groove" region, so that after encapsulation, the formed encapsulation layer can effectively block, for example, moisture or oxygen from permeating into the interior of such as the display device or other devices in the display region. However, because part of the film layer in the frame region surrounding the opening or the notch needs to be removed, a large segment gap or drop may be formed between different film layers, so that the flatness of the film layer surface in the frame region is poor, and when the above-mentioned driving connection wire and sensing connection wire are formed in the frame region, undesirable phenomena such as uneven etching or incomplete etching are likely to occur, which may result in a large amount of metal residues. And due to the small area space of the frame region, the driving connection wire and the sensing connection wire usually overlap with each other in the frame region, which leads to the risk of short circuit due to metal residues at the overlapping of the driving connection wire and the sensing connection wire, thus causing serious adverse effects on the signal transmission effect in the touch control structure and making it difficult for display products including the touch control structure to achieve good touch control performance.

At least one embodiment of the present disclosure provides an electronic substrate, and the electronic substrate includes a base substrate and at least one first signal line and at least one second signal line on the base substrate; the electronic substrate includes a first functional region and a peripheral region at least partially surrounding the first functional region, and the first signal line and the second signal line are in the peripheral region and at least partially surround the first functional region; the first signal line and the second signal line are spaced apart from each other and insulated from each other; at least one of the first signal line and the second signal line is configured to transmit an electrical signal for the first functional region; in a direction perpendicular to the base substrate, the first signal line partially overlaps with the second signal line in an overlapping region; and the first signal line includes a first wiring portion in the overlapping region and a second wiring portion outside the overlapping region, the second signal line includes a third wiring portion in the overlapping region and a fourth wiring portion outside the overlapping region, and a line width of the first wiring portion is different from a line width of the second wiring portion.

In the electronic substrate provided by the above-mentioned embodiment of the present disclosure, the line width of the first wiring portion in the first signal line that overlaps with the second signal line is different from the line width of the second wiring portion in the first signal line that does not overlap with the second signal line, and thus by adopting different line width designs for the first wiring portion in the overlapping region (that is, the region where the overlapping occurs between the first signal line and the second signal line) of the first signal line and the second wiring portion outside the overlapping region of the first signal line, it is beneficial to achieving the flexible adjustment and optimization of wiring layout in the overlapping region.

Furthermore, it is beneficial to reducing or avoiding the metal residue phenomenon that may occur in the overlapping region due to, for example, uneven etching or incomplete etching when the first wiring portion or the second signal line overlapping with the first wiring portion is formed in the overlapping region, thereby reducing the risk of short circuit caused by the metal residue phenomenon, improving the stability and reliability of signal transmission of the first signal line and the second signal line in the overlapping region, and improving the signal transmission effect, thus contributing to the optimization of the overall performance of the electronic substrate.

For example, in the electronic substrate provided by the embodiments of the present disclosure, the line width of the first wiring portion may be set to be smaller than the line width of the second wiring portion, that is, the line width of the first wiring portion in the first signal line that overlaps with the second signal line may be smaller than the line width of the second wiring portion in the first signal line that does not overlap with the second signal line. Therefore, by relatively reducing the line width of the first wiring portion, the spacing between adjacent first wiring portions in the overlapping region or the distance between the first wiring portion and other adjacent conductive wires or conductive structures can be increased, thereby reducing or avoiding undesirable phenomena such as uneven etching or incomplete etching that may occur when forming the first wiring portion and the second signal line overlapping with the first wiring portion in the overlapping region, and reducing or avoiding the residue of conductive substances such as the metal.

Hereinafter, the embodiments of the present disclosure will be described in detail with reference to the drawings. It should be noted that the same reference numerals in different drawings will be used to refer to the same described components or elements.

Figure 2:
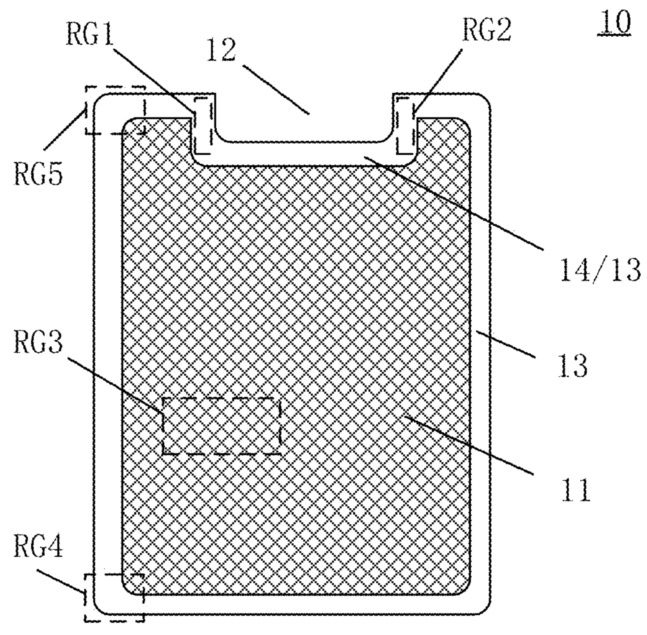
FIG. 2 is a schematic planar view of an electronic substrate provided by some embodiments of the present disclosure.
Figure 3:
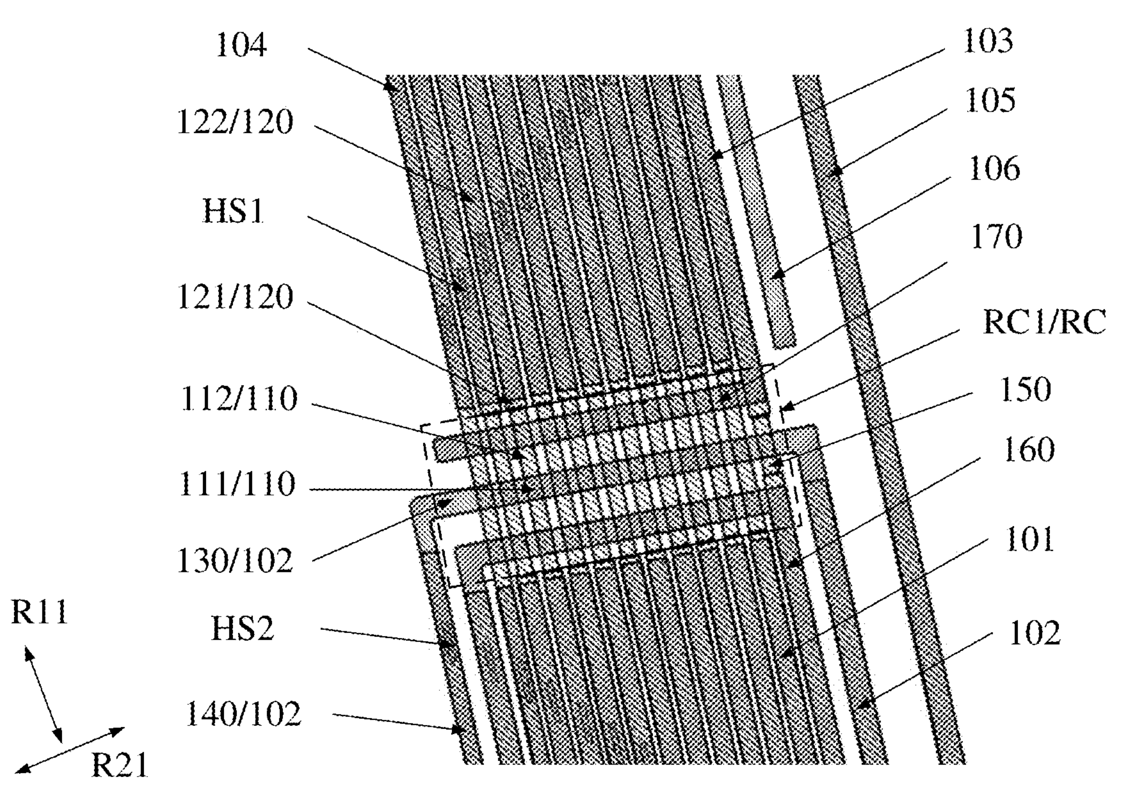
FIG. 3 is a schematic diagram of an example of a partial planar structure in the region RG1 shown in FIG. 2.
Figure 4:
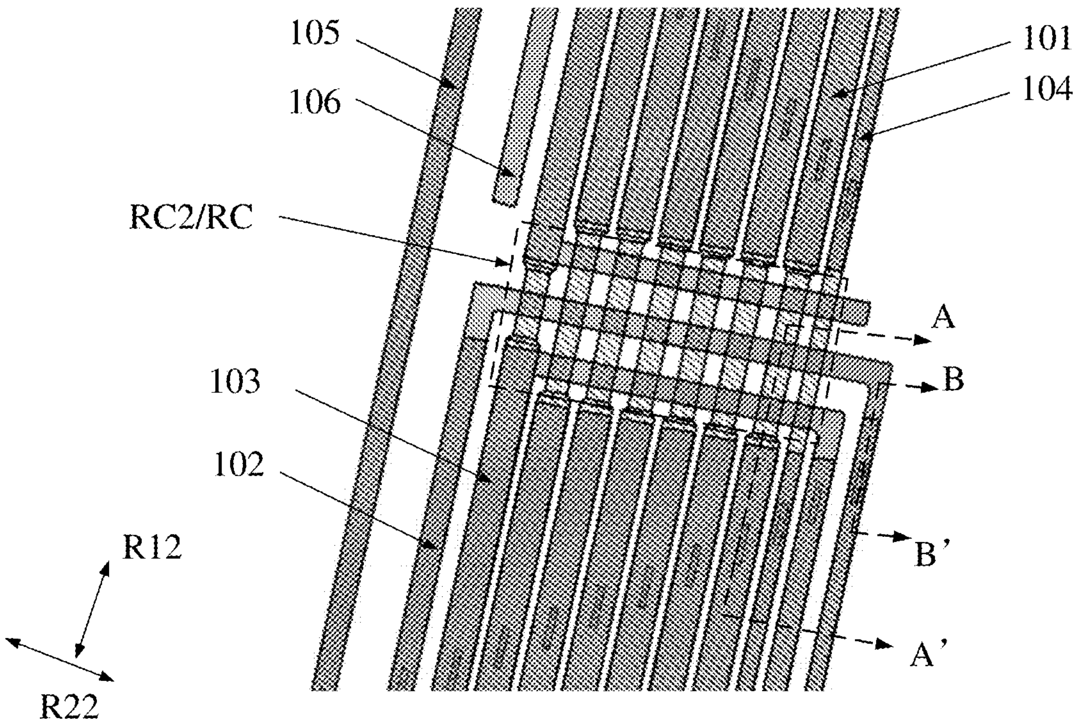
FIG. 4 is a schematic diagram of an example of a partial planar structure in the region RG2 shown in FIG. 2.
Figure 5A:
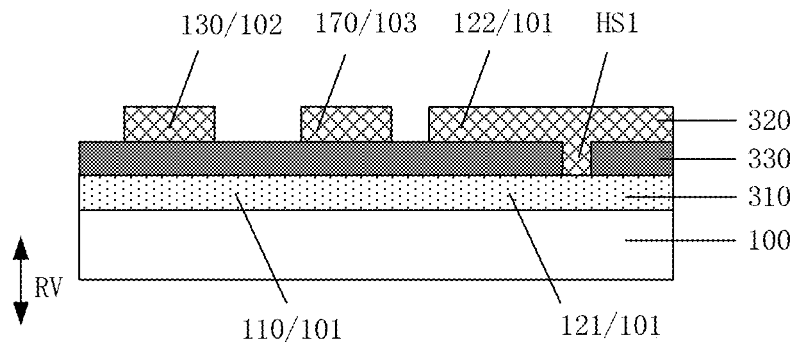
FIG. 5A is a schematic diagram of a cross-sectional structure of an electronic substrate provided by some embodiments of the present disclosure.
Figure 5B:
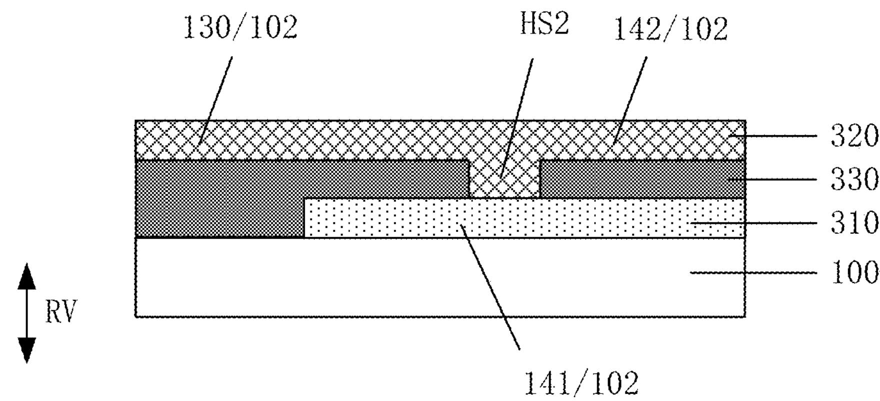
FIG. 5B is a schematic diagram of a cross-sectional structure of another electronic substrate provided by some embodiments of the present disclosure.

FIG. 2 is a schematic planar view of an electronic substrate provided by some embodiments of the present disclosure, FIG. 3 is a schematic diagram of an example of a partial planar structure in the region RG1 shown in FIG. 2, and FIG. 4 is a schematic diagram of an example of a partial planar structure in the region RG2 shown in FIG. 2. FIG. 5A is a schematic diagram of a cross-sectional structure of an electronic substrate provided by some embodiments of the present disclosure, for example, FIG. 5A is a schematic diagram of a partial cross-sectional structure along the line A-A' shown in FIG. 4, and FIG. 5B is a schematic diagram of a cross-sectional structure of another electronic substrate provided by some embodiments of the present disclosure, for example, FIG. 5B is a schematic diagram of a partial cross-sectional structure along the line B-B' shown in FIG. 4.

For example, as illustrated in FIG. 2 to FIG. 5B, the electronic substrate 10 includes a first functional region 11 and a peripheral region 13 at least partially surrounding the first functional region 11. For example, in the embodiments as illustrated in FIG. 2, the peripheral region 13 completely surrounds the first functional region 11. For example, the first functional region 11 is configured to have functions such as display, touch control, etc. For example, the first functional region 11 is configured as a touch control region or a display region, or may also be configured as a region with both the display function and the touch control function, and the embodiments of the present disclosure are not specifically limited in this aspect.

For example, in the embodiments shown in FIG. 2, the first functional region 11 includes an opening 12, and the peripheral region 13 includes an opening peripheral region 14 at least partially in the opening. For example, in the embodiments shown in FIG. 2, the opening 12 is a non-closed opening formed on one side of the first functional region 11 (e.g., a notch formed on one side of the first functional region 11), and the opening peripheral region 14 is only partially located in the non-closed opening. For another example, in some other embodiments, taking the electronic substrate 20 shown in FIG. 6 as an example, the opening 12 may also be a closed opening formed on one side of the first functional region 11, and the opening peripheral region 14 may be completely located in the closed opening. Alternatively, in some other embodiments, the above-mentioned closed opening or non-closed opening may also be formed on more sides of the first functional region 11, and the embodiments of the present disclosure are not specifically limited in this aspect. In the region where the opening 12 is located, devices such as a camera, a distance sensor, or the like may be arranged to facilitate the realization of narrow frame design.

Figure 6:
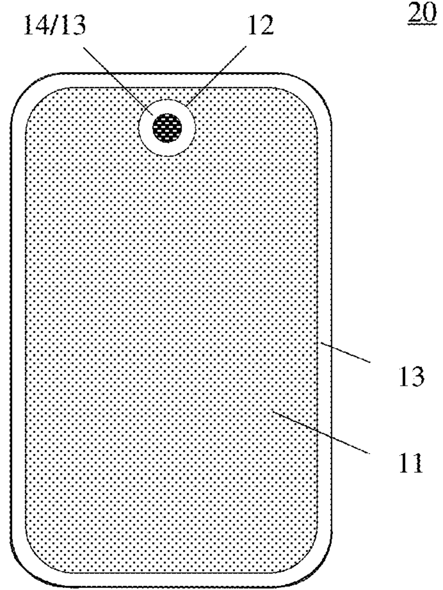
FIG. 6 is a schematic planar view of another electronic substrate provided by some embodiments of the present disclosure.

It should be noted that the embodiments of the present disclosure do not specifically limit the positions, numbers, shapes, contours, or the like of the openings 12 in the embodiments shown in FIG. 2 and FIG. 6. For example, the number of openings 12 may be one as illustrated in FIG. 2 or FIG. 6, or may be two, three or more; the openings 12 may be approximately square as illustrated in FIG. 2 or a circle as illustrated in FIG. 6, or other suitable regular or irregular shapes such as the regular hexagon, regular octagon, etc., and the embodiments of the present disclosure are not specifically limited in this aspect.

It should be noted that, in some other embodiments of the present disclosure, the first functional region 11 may not be provided with an opening or a notch, and the embodiments of the present disclosure are not specifically limited in this aspect.

It should be noted that the embodiments of the present disclosure do not specifically limit the shape or contour of the electronic substrate 10 or the electronic substrate 20. For example, the electronic substrate provided by the embodiments of the present disclosure may be a square as illustrated in FIG. 2 or FIG. 6, or may be in other suitable regular or irregular shapes such as a circle, a regular hexagon, a regular octagon, etc., which are not specifically limited by the embodiments of the present disclosure.

In the following, the embodiments of the present disclosure take the first functional region 11 with the non-closed opening shown in FIG. 2 as an example to describe the structure and function of the electronic substrate 10, but this does not constitute a limitation of the present disclosure. The embodiments of the present disclosure do not specifically limit whether the opening 12 is provided in the first functional region 11 of the electronic substrate 10 and the location and form of the opening 12 in the electronic substrate 10.

For example, as illustrated in FIG. 2 to FIG. 5B, the electronic substrate 10 includes a base substrate 100, and a first signal line 101 and a second signal line 102 on the base substrate 100. The first signal line 101 and the second signal line 102 are spaced apart and insulated from each other for transmitting different electrical signals, respectively.

For example, the first signal line 101 and the second signal line 102 are in the peripheral region 13 and are configured to transmit different electrical signals for the first functional region 11, respectively. For example, the first signal line 101 and the second signal line 102 are arranged around the first functional region 11. The specific arrangement in the peripheral region 13 in which the first signal line 101 and the second signal line 102 are arranged around the first functional region 11 may be determined according to specific functions and uses of the signals transmitted on the first signal line 101 and the second signal line 102, and the embodiments of the present disclosure are not specifically limited in this aspect.

For example, taking the first signal line 101 and the second signal line 102 in the opening peripheral region 14 shown in FIG. 3 and FIG. 4 as an example, the first signal line 101 and the second signal line 102 are arranged along the edge of the opening peripheral region 14 and configured to transmit electrical signals for the first functional region 11 located on opposite left and right sides of the opening 12.

For example, as illustrated in FIG. 3 to FIG. 5B, in the direction RV perpendicular to the base substrate 100, the first signal line 101 partially overlaps with the second signal line 102 in an overlapping region RC (for example, an overlapping region RC1 shown in FIG. 3 and an overlapping region RC2 shown in FIG. 4), that is, the orthographic projection of the first signal line 101 on the base substrate 100 partially overlaps with the orthographic projection of the second signal line 102 on the base substrate 100 in the overlapping region RC.

It should be noted that, according to actual layout requirements, in the peripheral region 13, the first signal line 101 may partially overlap with the second signal line 102 in one overlapping region RC, or the first signal line 101 may partially overlap with the second signal line 102 in a plurality of overlapping regions RC. For example, taking the electronic substrate 10 shown in FIG. 2 as an example, the first signal line 101 partially overlaps with the second signal line 102 both in the overlapping region RC1 shown in FIG. 3 and the overlapping region RC2 shown in FIG. 4.

Figure 12:
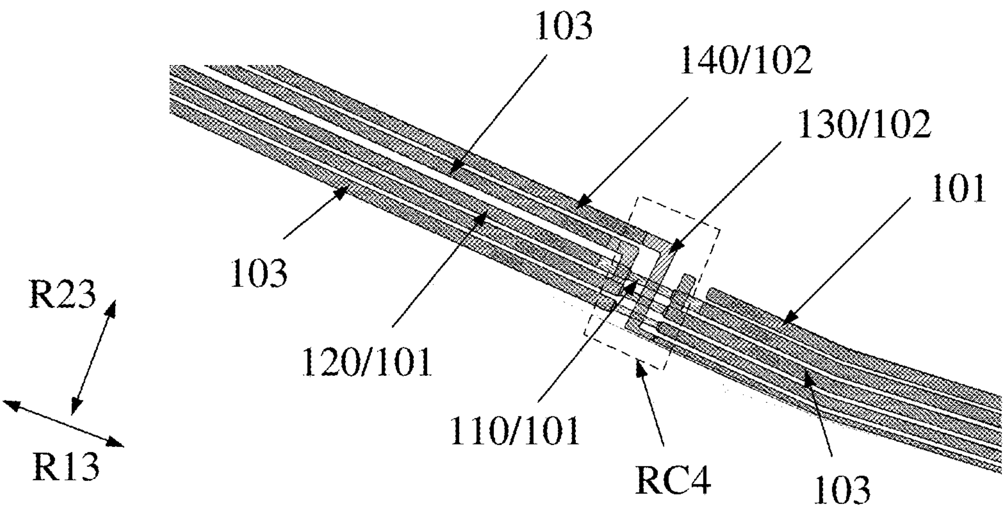
FIG. 12 is a schematic diagram of an example of a partial planar structure in the region RG4 shown in FIG. 2.
Figure 13A:
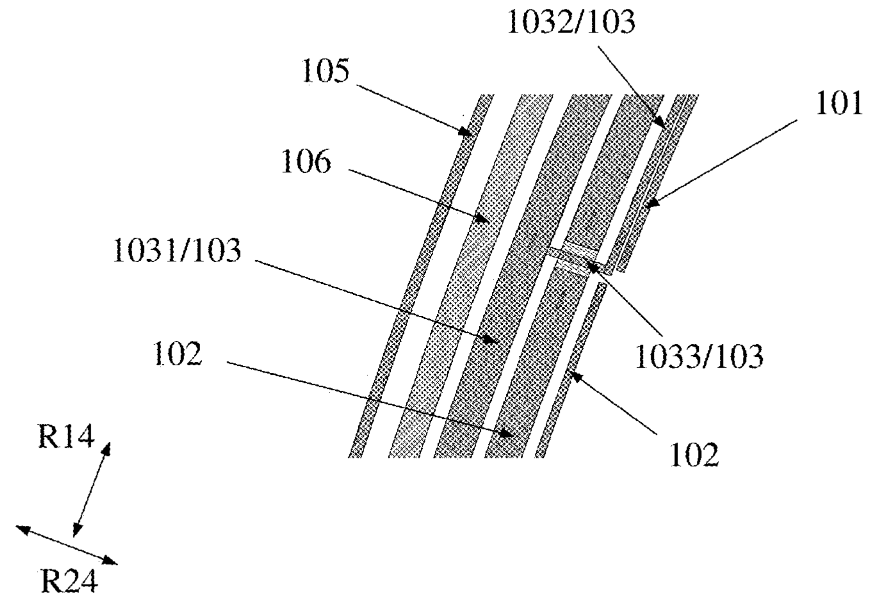
FIG. 13A to FIG. 13C are schematic diagrams of an example of a partial planar structure in the region RG5 shown in FIG. 2.
Figure 13B:
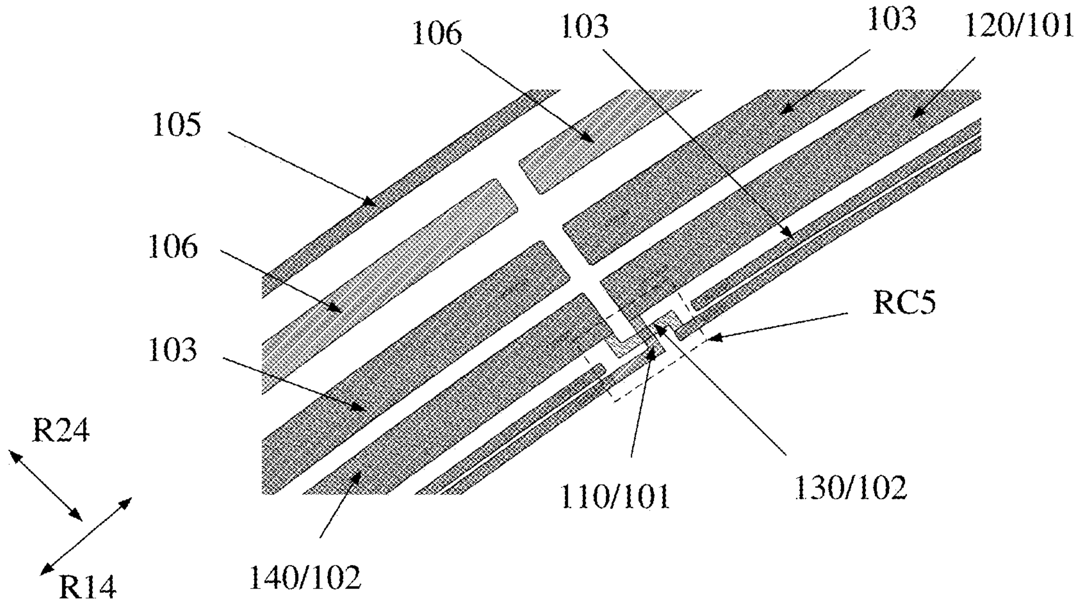

In some embodiments, taking the electronic substrate 10 shown in FIG. 2 as an example, the first signal line 101 may also partially overlap with the second signal line 102 in the overlapping region RC4 shown in FIG. 12 and the overlapping region RC5 shown in FIG. 13B.

For example, the first signal line 101 includes a first wiring portion 110 in the overlapping region RC and a second wiring portion 120 outside the overlapping region RC, and the second signal line 102 includes a third wiring portion 130 in the overlapping region RC and a fourth wiring portion 140 outside the overlapping region RC.

For example, the line width of the first wiring portion 110 is different from the line width of the second wiring portion 120. The line width of the first wiring portion 110 is the width of the orthographic projection of the first wiring portion 110 on the base substrate 100 in a direction perpendicular to the extending direction of the orthographic projection, and the line width of the second wiring portion 120 is the width of the orthographic projection of the second wiring portion 120 on the base substrate 100 in a direction perpendicular to the extending direction of the orthographic projection.

For example, taking the overlapping region RC1 shown in FIG. 3 as an example, the extending direction of the first wiring portion 110 (i.e., the extending direction of the orthographic projection of the first wiring portion 110 on the base substrate 100) and the extending direction of the second wiring portion 120 (i.e., the extending direction of the orthographic projection of the second wiring portion 120 on the base substrate 100) are both in the direction R11, and the width of the first wiring portion 110 in the direction (e.g., the direction R21) perpendicular to the direction R11 is different from the width of the second wiring portion 120 in the direction (e.g., the direction R21) perpendicular to the direction R11. For example, taking the overlapping region RC2 shown in FIG. 4 as an example, the extending direction of the first wiring portion 110 and the extending direction of the second wiring portion 120 are both in the direction R12, and the width of the first wiring portion 110 in the direction (e.g., the direction R22) perpendicular to the direction R12 is different from the width of the second wiring portion 120 in the direction (e.g., the direction R22) perpendicular to the direction R12.

Therefore, by adopting different line width designs for the first wiring portion 110 of the first signal line 101 in the overlapping region RC (that is, the region where the overlapping occurs between the first signal line 101 and the second signal line 102) and the second wiring portion 120 of the first signal line 101 outside the overlapping region RC, it is beneficial to implementing the flexible adjustment and optimization of wiring layout in the overlapping region RC. Furthermore, it is beneficial to reducing or avoiding the metal residue phenomenon that may occur in the overlapping region RC due to, for example, uneven etching or incomplete etching when the first wiring portion 110 or the second signal line 102 (e.g., the third wiring portion 130 of the second signal line 102) overlapping with the first wiring portion 110 is formed in the overlapping region RC, thereby reducing the risk of short circuit caused by the metal residue phenomenon, improving the stability and reliability of signal transmission of the first signal line 101 and the second signal line 102 in the overlapping region RC, and improving the signal transmission effect, thus contributing to the optimization of the overall performance of the electronic substrate 10.

It should be noted that, in the embodiments shown in FIG. 3 and FIG. 4, the extending direction of the first wiring portion 110 is substantially the same as the extending direction of the second wiring portion 120, that is, the extending directions of the first wiring portion 110 and the second wiring portion 120 are in the direction R11 or direction R12; and in some other embodiments of the present disclosure, the extending direction of the first wiring portion 110 may also be different from the extending direction of the second wiring portion 120, which is not specifically limited in the embodiments of the present disclosure.

For example, "the line width of the first wiring portion 110 is different from the line width of the second wiring portion 120" may refer to that the average line width of the first wiring portion 110 is different from the average line width of the second wiring portion 120, or may refer to that the variation status or variation rule of the line width of the first wiring portion 110 is different from the variation status or variation rule of the line width of the second wiring portion 120.

In some embodiments of the present disclosure, the line width of the first wiring portion 110 is smaller than the line width of the second wiring portion 120, for example, the average line width of the first wiring portion 110 is smaller than the average line width of the second wiring portion 120.

For example, taking the examples shown in FIG. 3 and FIG. 4 as an example, along the extending direction of the first wiring portion 110, the line widths of the first wiring portion 110 at different positions remain the same; along the extending direction of the second wiring portion 120, the line widths of the second wiring portion 120 at different positions remain the same; and the line width of each portion of the first wiring portion 110 is smaller than the line width of each portion of the second wiring portion 120. That is, the line width of the portion 111 of the first wiring portion 110 that overlaps with the second signal line 102 in the direction RV perpendicular to the base substrate 100 and the width of the portion 112 of the first wiring portion 110 that does not overlap with the second signal line 102 in the direction RV perpendicular to the base substrate 100 are both smaller than the line width of the second wiring portion 120.

Therefore, by relatively reducing the line width of the first wiring portion 110, the spacing between adjacent first wiring portions 110 in the overlapping region RC or the distance between the first wiring portion 110 and other adjacent conductive wires (for example, the third signal line 103 and the fourth signal line 104, which may refer to the detailed description later) can be increased, thereby reducing or avoiding undesirable phenomena such as uneven etching or incomplete etching that may occur when forming the first wiring portion 110 and the second signal line 102 (e.g., the third wiring portion 130 of the second signal line 102) overlapping with the first wiring portion 110 in the overlapping region RC, and reducing or avoiding the occurrence of metal residues. Furthermore, the risk of short circuit caused by the metal residue phenomenon can be reduced, the stability and reliability of signal transmission of the first signal line 101 and the second signal line 102 in the overlapping region RC can be improved, and the signal transmission effect can be improved, thereby contributing to the optimization of the overall performance of the electronic substrate 10.

For example, the line width of the first wiring portion 110 may range from 4 μm to 8 μm, such as 4.5 μm, 4.7 μm, 5.5 μm, 6.5 μm, 7 μm, 7.7 μm, or the like, and the line width of the second wiring portion 120 may range from 10 μm to 15 μm.

Figure 7:
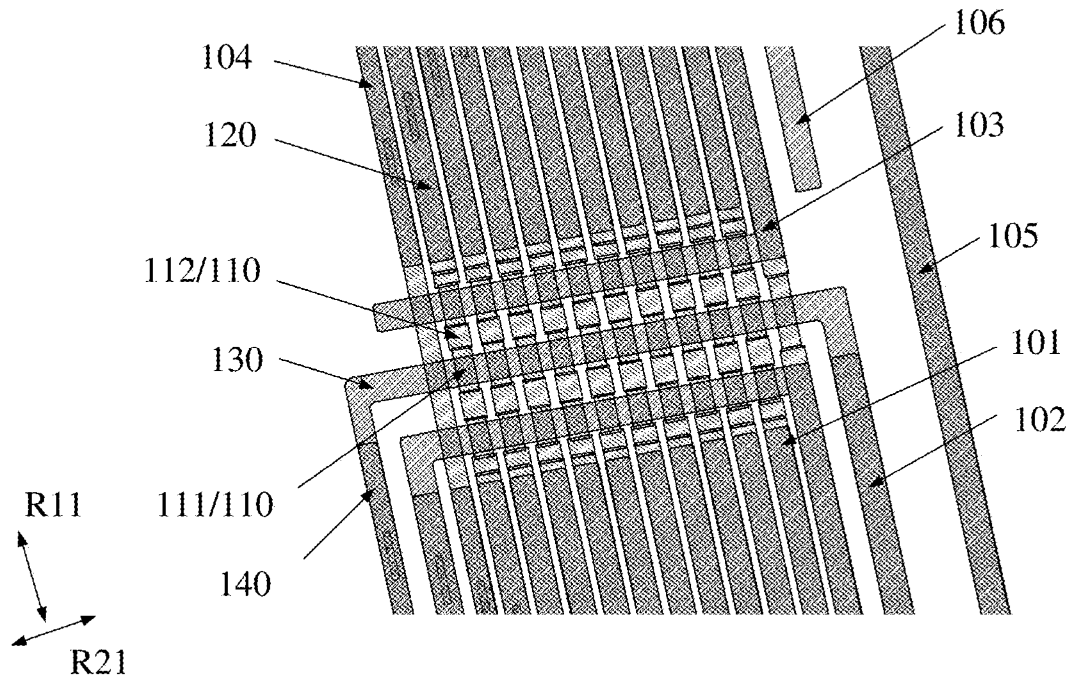
FIG. 7 is a schematic diagram of another example of a partial planar structure in the region RG1 shown in FIG. 2.

In some embodiments of the present disclosure, for example, as illustrated in FIG. 7, it is also possible that the line width of the portion 111 of the first wiring portion 110 that overlaps with the second signal line 102 in the direction RV perpendicular to the base substrate 100 is smaller than the line width of the second wiring portion 120, and the line width of the portion 112 of the first wiring portion 110 that does not overlap with the second signal line 102 in the direction RV perpendicular to the base substrate 100 is substantially the same as the line width of the second wiring portion 120. Accordingly, it is possible to reduce or avoid undesirable phenomena such as uneven etching or incomplete etching that may occur when forming the first wiring portion 110 and the third wiring portion 130 in the overlapping region RC, thereby reducing or avoiding the occurrence of metal residues, and it is also possible to improve the stability and reliability of signal transmission of the first signal line 101 in the overlapping region RC. For example, the line width of the portion 112 of the first wiring portion 110 that does not overlap with the second signal line 102 in the direction RV perpendicular to the base substrate 100 may be greater than the line width of the portion 111 of the first wiring portion 110 that overlaps with the second signal line 102 in the direction RV perpendicular to the base substrate 100, and smaller than or substantially equal to the line width of the second wiring portion 120.

Figure 8:
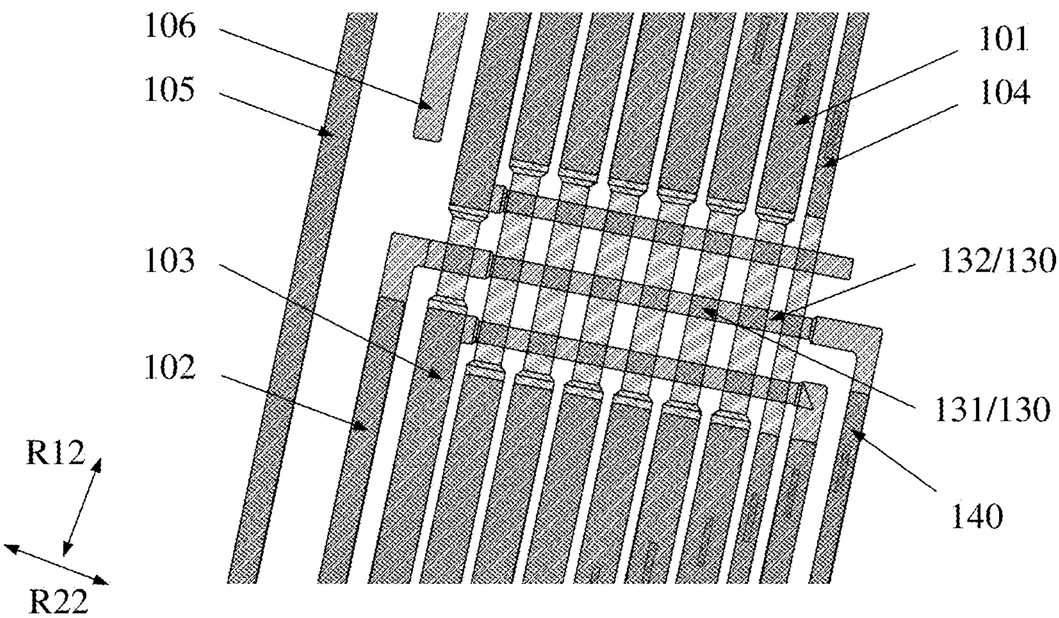
FIG. 8 is a schematic diagram of another example of a partial planar structure in the region RG2 shown in FIG. 2.

In some embodiments of the present disclosure, for example, as illustrated in FIG. 8, the line width of the third wiring portion 130 of the second signal line 102 may also be different from the line width of the fourth wiring portion 140. For example, the average line width of the third wiring portion 130 is smaller than the average line width of the fourth wiring portion 140, so as to further reduce or avoid the undesirable phenomena such as uneven etching or incomplete etching that may occur when forming the first wiring portion 110 and the third wiring portion 130 in the overlapping region RC, thereby reducing or avoiding the occurrence of metal residues.

For example, as illustrated in FIG. 8, the line width of a portion 131 of the third wiring portion 130 that overlaps with the first signal line 101 in the direction RV perpendicular to the base substrate 100 is smaller than the line width of the fourth wiring portion 140, and the line width of a portion 132 of the third wiring portion 130 that does not overlap with the first signal line 101 in the direction RV perpendicular to the base substrate 100 is also smaller than the line width of the fourth wiring portion 140. For example, the line width of the portion 131 of the third wiring portion 130 that overlaps with the first signal line 101 and the line width of the portion 132 of the third wiring portion 130 that does not overlap with the first signal line 101 are substantially the same, so that the manufacturing process of the second signal line 102 can be simplified and the manufacturing cost can be reduced. Alternatively, in some other embodiments of the present disclosure, the line width of the portion 132 of the third wiring portion 130 that does not overlap with the first signal line 101 in the direction RV perpendicular to the base substrate 100 may also be substantially the same as the line width of the fourth wiring portion 140, thereby improving the stability and reliability of signal transmission of the second signal line 102 in the overlapping region RC.

The following embodiments of the present disclosure further describe the structure, function, or the like of the electronic substrate 10 by taking the line widths and overlapping conditions of the first signal line 101 and the second signal line 102 shown in FIG. 3 and FIG. 4 as an example. It should be noted that, except for the arrangements of the line widths of different wiring portions in the first signal line 101 and the second signal line 102, the arrangements of the first signal line 101, the second signal line 102, and other signal lines in the embodiments shown in FIG. 7 and FIG. 8 are basically the same as or similar to the arrangements in the embodiments shown in FIG. 3 and FIG. 4, the specific content may refer to the corresponding descriptions in the embodiments as shown in FIG. 3 and FIG. 4, and repetitions or similarities will not be repeated.

For example, as illustrated in FIG. 5A and FIG. 5B, the electronic substrate 10 includes a first conductive layer 310, an insulating layer 330, and a second conductive layer 320. The first conductive layer 310, the insulating layer 330, and the second conductive layer 320 are on the base substrate 100, and the first conductive layer 310, the insulating layer 330, and the second conductive layer 320 are stacked with each other. The insulating layer 330 is between the first conductive layer 310 and the second conductive layer 320, and the first conductive layer 310 and the second conductive layer 320 are spaced apart and insulated from each other in the direction RV perpendicular to the base substrate 100 by the insulating layer 330.

For example, in the embodiments shown in FIG. 5A and FIG. 5B, the second conductive layer 320 is on a side of the first conductive layer 310 away from the base substrate 100, that is, the first conductive layer 310, the insulating layer 330 and the second conductive layer 320 are sequentially stacked on the base substrate 100. Alternatively, in some other embodiments of the present disclosure, it is also possible that the first conductive layer 310 is on a side of the second conductive layer 320 away from the base substrate 100, that is, the second conductive layer 320, the insulating layer 330 and the first conductive layer 310 are sequentially stacked on the base substrate 100, and the embodiments of the present disclosure are not specifically limited in this aspect.

For example, as illustrated in FIG. 3 to FIG. 5B, the first wiring portion 110 is in the first conductive layer 310, the second wiring portion 120 includes a first sub-portion 121 in the first conductive layer 310 and a second sub-portion 122 in the second conductive layer 320, and the first sub-portion 121 of the second wiring portion 120 is electrically connected to the second sub-portion 122 of the second wiring portion 120 through a via hole structure HS1 at least penetrating the insulating layer 330. Therefore, by enabling the second wiring portion 120 to adopt the layout design of the double-layer wiring structure, the stability and reliability of the signal transmission on the first signal line 101 can be improved, and the signal transmission effect is improved.

For example, the first wiring portion 110 is connected to and integrally provided with the first sub-portion 121 of the second wiring portion 120. For example, the first wiring portion 110 and the first sub-portion 121 of the second wiring portion 120 are formed by applying the same process to the first conductive layer 310, thereby simplifying the manufacturing process of the first signal line 101 and reducing the manufacturing cost.

For example, the third wiring portion 130 is in the second conductive layer 320, the fourth wiring portion 140 includes a first sub-portion 141 in the first conductive layer 310 and a second sub-portion 142 in the second conductive layer 320, and the first sub-portion 141 of the fourth wiring portion 140 is electrically connected to the second sub-portion 142 of the fourth wiring portion 140 through a via hole structure HS2 at least penetrating the insulating layer 330. Therefore, by enabling the fourth wiring portion 140 to adopt the layout design of the double-layer wiring structure, the stability and reliability of the signal transmission on the second signal line 102 can be improved, and the signal transmission effect is improved.

For example, the third wiring portion 130 is connected to and integrally provided with the second sub-portion 142 of the fourth wiring portion 140. For example, the third wiring portion 130 and the second sub-portion 142 of the fourth wiring portion 140 are formed by applying the same process to the second conductive layer 320, thereby simplifying the manufacturing process of the second signal line 102 and reducing the manufacturing cost.

It should be noted that, in the above-mentioned embodiments of the present disclosure, the second conductive layer 320 is on the side of the first conductive layer 310 away from the base substrate 100, that is, in the overlapping region RC, the third wiring portion 130 is on a side of the first wiring portion 110 away from the base substrate 100. Correspondingly, in some other embodiments in which the first conductive layer 310 is on a side of the second conductive layer 320 away from the base substrate 100, in the overlapping region RC, the first wiring portion 110 is on a side of the third wiring portion 130 away from the base substrate 100.

In some embodiments of the present disclosure, as illustrated in FIG. 3, the extending direction R11 of the orthographic projection of the first wiring portion 110 on the base substrate 100 is substantially perpendicular to the extending direction R12 of the orthographic projection of the third wiring portion 130 on the base substrate 100; and as illustrated in FIG. 4, the extending direction R12 of the orthographic projection of the first wiring portion 110 on the base substrate 100 is substantially perpendicular to the extending direction R22 of the orthographic projection of the third wiring portion 130 on the base substrate 100. That is, in the direction RV perpendicular to the base substrate 100, the first wiring portion 110 and the third wiring portion 130 overlap with each other and are substantially perpendicular to each other, thereby reducing or avoiding possible signal interference between the first signal line 101 and the second signal line 102, improving the stability and reliability of the signal transmission of the first signal line 101 and the second signal line 102 in the overlapping region RC, and improving the signal transmission effect.

For example, as illustrated in FIG. 3 and FIG. 4, the orthographic projection of the first wiring portion 110 on the base substrate 100 and the orthographic projection of the second wiring portion 120 on the base substrate 100 are substantially in the same straight line. For example, in a plane parallel to the base substrate 100, both the first wiring portion 110 and the second wiring portion 120 extend substantially along the direction R11 or the direction R12. For example, the first wiring portion 110 is between two second wiring portions 120, two ends of the first wiring portion 110 are respectively connected to the two second wiring portions 120, and a centerline of the first wiring portion 110 along the direction R11 (or the direction R12) and centerlines of the two second wiring portions 120 along the direction R11 (or the direction R12) are substantially in the same straight line.

For example, in a plane parallel to the base substrate 100, the third wiring portion 130 extends substantially along the direction R21 or the direction R22, and the fourth wiring portion 140 extends substantially along the direction R11 or the direction R12. That is, the extending direction of the orthographic projection of the third wiring portion 130 on the base substrate 100 is substantially perpendicular to the extending direction of the orthographic projection of the fourth wiring portion 140 on the base substrate 100. For example, the third wiring portion 130 is between two fourth wiring portions 140, and two ends of the third wiring portion 130 are respectively connected to the two fourth wiring portions 140 to achieve signal transmission between the two fourth wiring portions 140.

For example, the second wiring portion 120 and the fourth wiring portion 140 are arranged side by side with each other in the plane parallel to the base substrate 100. In the plane parallel to the base substrate 100, the extending direction (e.g., the direction R11 or the direction R12) of the second wiring portion 120 is substantially the same as the extending direction (e.g., the direction R11 or the direction R12) of the fourth wiring portion 140. That is, the extending direction of the orthographic projection of the second wiring portion 120 on the base substrate 100 is substantially parallel to the extending direction of the orthographic projection of the fourth wiring portion 140 on the base substrate 100.

For example, the second wiring portion 120 is between two fourth wiring portions 140. For example, in the case where the electronic substrate 10 shown in FIG. 3 or FIG. 4 includes a plurality of first signal lines 101, the second wiring portions 120 of the plurality of first signal lines 101 are sequentially arranged side by side between the two fourth wiring portions 140.

For example, in the embodiments shown in FIG. 3 and FIG. 4, the plurality of first signal lines 101 are arranged side by side with each other in the plane parallel to the base substrate 100, for example, sequentially arranged side by side along the direction R21 or the direction R22. Among the plurality of first signal lines 101, the distance between the first wiring portions 110 of two adjacent first signal lines 101 is greater than the distance between the second wiring portions 120 of the two adjacent first signal lines 101. Thus, by increasing the distance between adjacent wiring portions in the region where the overlapping occurs between the first signal line 101 and the second signal line 102, it is possible to reduce or avoid the metal residue phenomenon that may occur due to, for example, uneven etching or incomplete etching, thereby reducing the risk of short circuit caused by the metal residue phenomenon.

For example, the plurality of first signal lines 101 are sequentially arranged along the direction R21 or the direction R22. Among the plurality of first signal lines 101, the via hole structures HS1 in the first signal lines 101 for connecting the first sub-portion 121 and the second sub-portion 122 of the second wiring portion 120 are staggered with each other along the direction R21 or the direction R22. For example, as illustrated in FIG. 3 and FIG. 4, the plurality of via hole structures HS1 in the plurality of first signal lines 101 are staggered with each other along a direction away from the first functional region 11 and are arranged in a stepped shape, so that the short circuit phenomenon that may occur between the adjacent first signal lines 101 can be reduced or avoided, the precision requirements of the manufacturing process of the electronic substrate 10 can be reduced, and the manufacturing cost of the electronic substrate 10 can be reduced.

For example, as illustrated in FIG. 3 and FIG. 4, the electronic substrate 10 further includes a third signal line 103 on the base substrate 100. The third signal line 103 is in the peripheral region 13 and at least partially surrounds the first functional region 11, and the third signal line 103 is spaced apart and insulated from the first signal line 101 and the second signal line 102, respectively, for transmitting a different electrical signal. In the direction RV perpendicular to the base substrate 100, the third signal line 103 partially overlaps with the second signal line 102 in the overlapping region RC.

For example, the third signal line 103 includes a fifth wiring portion 150 in the overlapping region RC and a sixth wiring portion 160 outside the overlapping region RC. The fifth wiring portion 150 is in the first conductive layer 310, the sixth wiring portion 160 includes a first sub-portion in the first conductive layer 310 and a second sub-portion in the second conductive layer 320, and the first sub-portion of the sixth wiring portion 160 is electrically connected to the second sub-portion of the sixth wiring portion 160 through the via hole structure at least penetrating the insulating layer 330.

For example, the fifth wiring portion 150 is connected to and integrally provided with the first sub-portion of the sixth wiring portion 160, and the line width of the fifth wiring portion 150 is different from the line width of the sixth wiring portion 160.

For example, the extending direction of the orthographic projection of the fifth wiring portion 150 on the base substrate 100 is substantially perpendicular to the extending direction of the orthographic projection of the third wiring portion 130 on the base substrate 100. For example, in the plane parallel to the base substrate 100, the fifth wiring portion 150 extends substantially along the direction R11 or the direction R12 and partially overlaps with the third wiring portion 130 of the second signal line 102 in the overlapping region RC.

For example, the extending direction of the orthographic projection of the fifth wiring portion 150 on the base substrate 100 is substantially the same as the extending direction of the orthographic projection of the sixth wiring portion 160 on the base substrate 100, that is, in the plane parallel to the base substrate 100, the fifth wiring portion 150 and the sixth wiring portion 160 both extend substantially along the direction R11 or the direction R12.

For example, the third signal line 130 further includes a seventh wiring portion 170 in the overlapping region RC, the seventh wiring portion 170 is in the second conductive layer 320, and the seventh wiring portion 170 is connected to and integrally provided with the second sub-portion of the sixth wiring portion 160. In the direction RV perpendicular to the base substrate 100, the seventh wiring portion 170 partially overlaps with the first signal line 101 in the overlapping region RC.

For example, the extending direction of the orthographic projection of the seventh wiring portion 170 on the base substrate 100 is substantially perpendicular to the extending direction of the orthographic projection of the first wiring portion 110 on the base substrate 100. For example, in the plane parallel to the base substrate 100, the seventh wiring portion 170 extends substantially along the direction R21 or the direction R22 and partially overlaps with the first wiring portion 110 of the first signal line 101 in the overlapping region RC.

For example, in the example shown in FIG. 3 and FIG. 4 in which the third signal line 130 includes a plurality of seventh wiring portions 170, the plurality of seventh wiring portions 170 and the third wiring portion 130 are arranged side by side in the direction R11 or the direction R12. For example, in the direction R11 or the direction R12, the third wiring portion 130 may be located between two adjacent seventh wiring portions 170.

For example, as illustrated in FIG. 3 and FIG. 4, the electronic substrate 10 further includes a fourth signal line 104 on the base substrate 100. The fourth signal line 104 is in the peripheral region 13 and at least partially surrounds the first functional region 11. The fourth signal line 104 is spaced apart and insulated from the first signal line 101, the second signal line 102, and the third signal line 103, respectively.

For example, in the direction RV perpendicular to the base substrate 100, the fourth signal line 104 partially overlaps with the second signal line 102 in the overlapping region RC. The fourth signal line 104 and the first signal line 101 are arranged side by side in the plane parallel to the base substrate 100, and for example, the fourth signal line 104 may be located on a side of the first signal line 101 close to the first functional region 11. The extending direction of the orthographic projection of the fourth signal line 104 on the base substrate 100 is substantially parallel to the extending direction of the orthographic projection of the first signal line 101 on the base substrate 100, that is, in the plane parallel to the base substrate 100, the fourth signal line 104 extends substantially along the direction R11 or the direction R12. For example, the line width of the fourth signal line 104 may be smaller than or equal to the line width of the second wiring portion 120, for example, the line width of the fourth signal line 104 may be set to be substantially the same as the line width of the first wiring portion 110, so as to facilitate reducing or avoiding possible signal interference with the first functional region 11. For example, except for the line width, the layout design of the wiring portions in the fourth signal line 104 may be substantially the same as or similar to that of the first signal line 101, which will not be repeated here.

For example, as illustrated in FIG. 3 and FIG. 4, the electronic substrate 10 further includes a fifth signal line 105 and a sixth signal line 106 on the base substrate 100. The fifth signal line 105 and the sixth signal line 106 are in the peripheral region 13 and at least partially surround the first functional region 11, and the fifth signal line 105 and the sixth signal line 106 are spaced apart and insulated from the first signal line 101, the second signal line 102, the third signal line 103, and the fourth signal line 104, respectively.

For example, in the plane parallel to the base substrate 100, the fifth signal line 105 and the sixth signal line 106 extend substantially along the direction R11 or the direction R12, respectively, that is, the extending direction of the fifth signal line 105 and the extending direction of the sixth signal line 106 may be set to be substantially parallel to the extending direction of the first signal line 101 or the fourth signal line 104.

For example, in the plane parallel to the base substrate 100, the first signal line 101, the sixth signal line 106, and the fifth signal line 105 are sequentially arranged side by side along the direction R21 or the direction R22. For example, in the direction R21 or the direction R22, the first signal line 101, the sixth signal line 106, and the fifth signal line 105 are sequentially arranged along the direction away from the first functional region 11, that is, the fifth signal line 105 is on a side of the six signal line 106 away from the first functional region 11, and the sixth signal line 106 is on the side of the first signal line 101 away from the first functional region 11.

For example, the sixth signal line 106 is in the second conductive layer 320, and the fifth signal line 105 is in both the first conductive layer 310 and the second conductive layer 320, which may be electrically connected through the via hole structure at least penetrating the insulating layer 330.

Hereinafter, the embodiments of the present disclosure take the electronic substrate 10 as an electronic substrate having the display function and the touch control function as an example to illustrate the specific functions, connection relationships, arrangement positions, or the like of the above-mentioned signal lines. It should be noted that the embodiments of the present disclosure include but are not limited to this.

Figure 9:
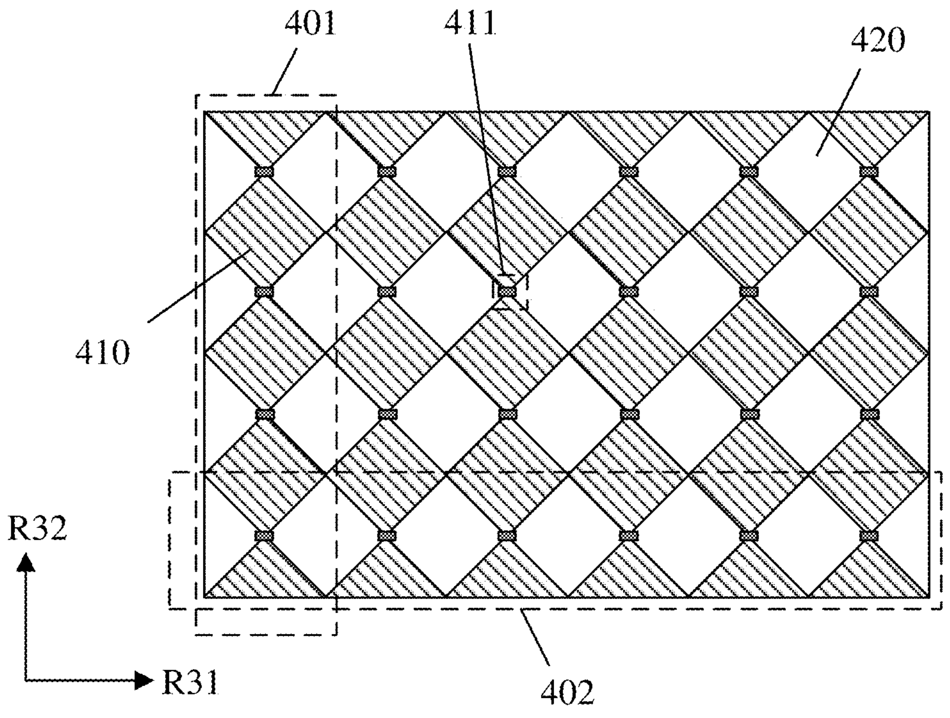
FIG. 9 is a schematic diagram of an example of a partial planar structure in the region RG3 shown in FIG. 2.
Figure 10:
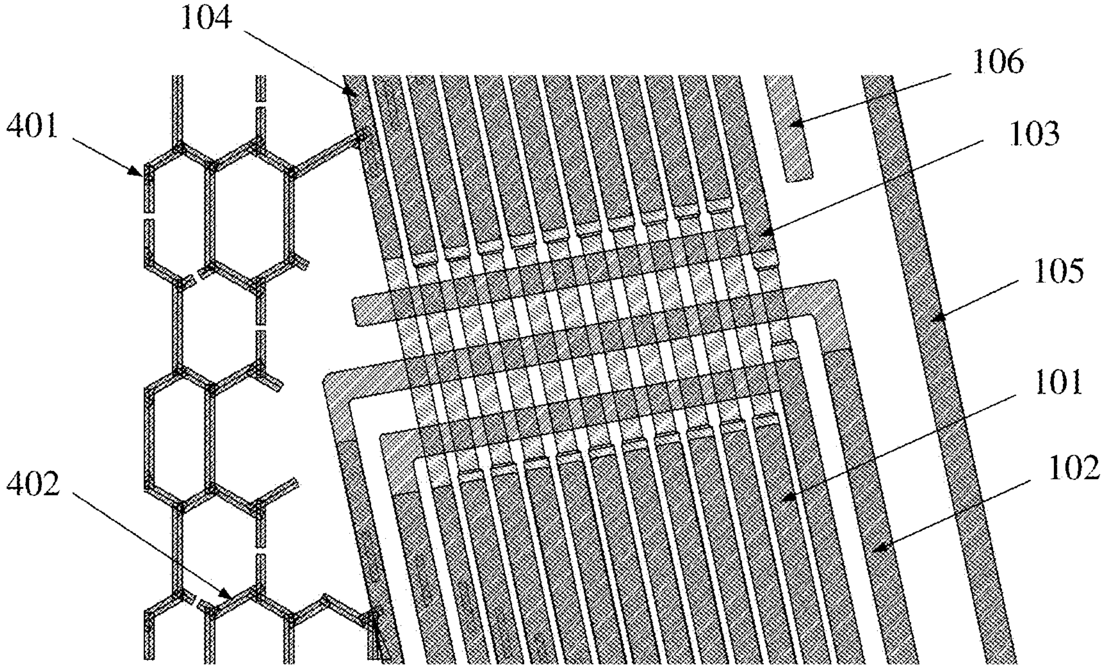
FIG. 10 is a schematic diagram of further still another example of a partial planar structure in the region RG1 shown in FIG. 2.
Figure 11:
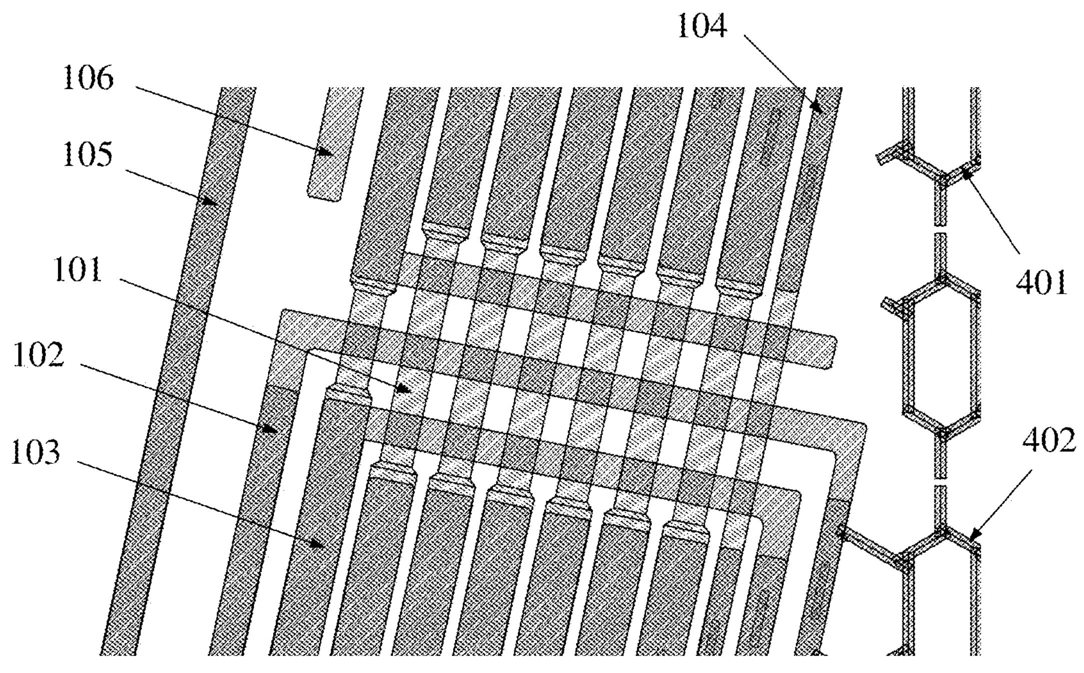
FIG. 11 is a schematic diagram of further still another example of a partial planar structure in the region RG2 shown in FIG. 2.

FIG. 9 is an enlarged schematic diagram of a partial region of an electronic substrate provided by some embodiments of the present disclosure. For example, FIG. 9 is a schematic diagram of an example of a partial planar structure in the region RG3 shown in FIG. 2. Correspondingly, FIG. 10 provides a schematic diagram of an example of a partial planar structure in the region RG1 shown in FIG. 2 in the example corresponding to FIG. 9; and FIG. 11 provides a schematic diagram of an example of a partial planar structure in the region RG2 shown in FIG. 2 in the example corresponding to FIG. 9. It should be noted that, except for the first touch control electrode 401 and the second touch control electrode 402, other structures in the example of the electronic substrate 10 shown in FIG. 9 to FIG. 11 may refer to corresponding descriptions in the embodiments shown in FIG. 3 and FIG. 4, which will not be repeated here.

For example, in the example shown in FIG. 9, the electronic substrate 10 includes a plurality of first touch control electrodes 401 and a plurality of second touch control electrodes 402 on the base substrate 100. The plurality of first touch control electrodes 401 are arranged along a first direction R31, and each of the first touch control electrodes 401 extends along a second direction R32 different from the first direction R31. The plurality of second touch control electrodes 402 are arranged along the second direction R32, and each of the second touch control electrodes 402 extends along the first direction R31.

For example, the included angle between the first direction R31 and the second direction R32 may be set between 70° and 90°, including 70° and 90°, for example, the included angle between the first direction R31 and the second direction R32 may be set to 70°, 75°, 80°, 85°, 90°, etc. The specific value of the included angle may be set according to the actual situation, which is not specifically limited by the embodiments of the present disclosure.

For example, in the electronic substrate 10 provided by the embodiments of the present disclosure, the first direction R31 may be set to be perpendicular to the second direction R32. In the case where the electronic substrate 10 provided by the embodiments of the present disclosure is applied to, for example, a display panel or a display device, the first direction R31 may be a row direction of a sub-pixel array in the display panel or the display device, and the second direction R32 may be a column direction of a sub-pixel array in the display panel or the display device; alternatively, the first direction R31 is the column direction of the sub-pixel array in the display panel or the display device, and the second direction R32 is the row direction of the sub-pixel array in the display panel or the display device, which are not specifically limited by the embodiments of the present disclosure.

For example, each first touch control electrode 401 includes a plurality of first touch control sub-electrodes 410 and a plurality of first connection electrodes 411. The plurality of first touch control sub-electrodes 410 are arranged along the second direction R32, and the first connection electrode 411 is between two adjacent first touch control sub-electrodes 410 in the second direction R32, so that the two adjacent first touch control sub-electrodes 410 are electrically connected to each other through the first connection electrode 411. For example, each second touch control electrode 402 includes a plurality of second touch control sub-electrodes 420 and a plurality of second connection electrodes (not shown in the figure). The plurality of second touch control sub-electrodes 420 are arranged along the first direction R31, and the second connection electrode is between two adjacent second touch control sub-electrodes 420 in the first direction R31, so that the two adjacent second touch control sub-electrodes 420 are electrically connected to each other through the second connection electrode.

It should be noted that, the number of the first touch control sub-electrodes 410 and the first connection electrodes 411 included in the first touch control electrode 401 shown in FIG. 9, the number of the second touch control sub-electrodes 420 included in the second touch control electrode 402, and the like are only illustrative, and are not specifically limited by the embodiments of the present disclosure. It should be noted that, the main body contours of the first touch control sub-electrode 410 in the first touch control electrode 401 and the second touch control sub-electrode 420 in the second touch control electrode 402 shown in FIG. 9 are rhombuses. In some other embodiments or examples of the present disclosure, the first touch control sub-electrode 410 and the second touch control sub-electrode 420 may also adopt other regular shapes such as the triangle, rectangle, hexagon, octagon, strip, etc., or irregular shapes, which are not specifically limited by the embodiments of the present disclosure. For example, the main body contours of the first touch control sub-electrode 410 and the second touch control sub-electrode 420 may be the same or different from each other.

For example, the first touch control sub-electrode 410 and the first connection electrode 411 are respectively located in different conductive layers relative to the base substrate 100. For example, the first touch control sub-electrode 410 may be located in the second conductive layer 320 shown in FIG. 5A and FIG. 5B, the first connection electrode 411 is in the first conductive layer 310 shown in FIG. 5A and FIG. 5B, and the first touch control sub-electrode 410 is electrically connected to the first connection electrode 411 through the via hole structure at least penetrating the insulating layer 330. For example, the second touch control sub-electrode 420 and the second connection electrode may be in the same conductive layer relative to the base substrate 100, and for example, may be both in the second conductive layer 320 shown in FIG. 5A and FIG. 5B, that is, the second touch control sub-electrode 420 and the second connection electrode are in the same conductive layer as the first touch control sub-electrode 410 and for example, are insulated from the first touch control sub-electrode 410. For example, the second touch control sub-electrode 420 and the second connection electrode correspondingly connected to the second touch control sub-electrode 420 are integrally provided.

For example, the first touch control electrode 401 and the second touch control electrode 402 may be both in the first functional region 11 to implement the touch control function. For example, the first signal line 101 is configured to be connected to the corresponding first touch control electrode 401 to provide a first touch control signal that is required, and the second signal line 102 is configured to be connected to the corresponding second touch control electrode 402 to provide a second touch control signal that is required.

For example, the third signal line 103 is configured to transmit a constant voltage or current signal, so as to reduce or avoid possible mutual interference between other wires, devices or structures in the electronic substrate 10 and the first signal line 101 as well as the second signal line 102, thereby improving the stability and reliability of the electronic substrate 10.

For example, the fourth signal line 104 is configured to implement the same function as the first signal line 101, that is, the fourth signal line 104 is also configured to be connected to the corresponding first touch control electrode 401 to provide the first touch control signal that is required.

For example, the fifth signal line 105 is configured to transmit a constant low voltage signal or a ground signal. In this way, possible adverse effects on the signal transmission of the first signal line 101 and the second signal line 102 can be reduced or avoided. For example, the fifth signal line 105 is provided on a side of the first signal line 101 and the second signal line 102 away from the first functional region 11, thereby reducing or avoiding possible interference caused by the external environment or devices that may affect the signals transmitted on the first signal line 101 and the second signal line 102, and optimizing the signal transmission effect on the first signal line 101 and the second signal line 102. It is also possible to reduce or avoid the possible adverse effects on the first signal line 101 and the second signal line 102 that may be caused in the manufacturing process of the electronic substrate 10, thereby improving the stability and reliability of the electronic substrate 10.

For example, the sixth signal line 106 is configured to be in a suspended or floating state, for example, the sixth signal line 106 is not connected to any signal source, thereby further reducing or avoiding the possible mutual interference between other wires, devices or structures in the electronic substrate 10 and the first signal line 101 as well as the second signal line 102, and improving the stability and reliability of the electronic substrate 10.

For example, the first functional region 11 may be configured as a touch control region, or may also be configured as a region having other functions different from the touch control function, such as a display region, an imaging region, or the like. For example, in the case where the electronic substrate 10 has both the display function and the touch control function, the first functional region 11 is configured as a region having both the display function and the touch control function, and the embodiments of the present disclosure are not specifically limited in this aspect.

In some embodiments of the present disclosure, each of the first touch control electrodes 401 and each of the second touch control electrodes 402 may respectively include a grid-like structure formed by a plurality of metal grids, for example, the metal grid is a closed metal grid or a non-closed metal grid. It should be noted that, the patterns (e.g., the contour, number, size, shape, or the like of the metal grid included) of the grid-like structure shown in FIG. 10 and FIG. 11 are only illustrative, and the number of, for example, metal grids formed in the grid-like structure, and specific pattern features such as the shape, contour, size, or the like are not limited by the embodiments of the present disclosure. For example, the metal grids in the mesh-like structure shown in FIG. 10 and FIG. 11 are all polygons, such as hexagons, and in some other embodiments of the present disclosure, the shape of the metal grid may also be other polygons, such as the triangle, quadrangle, pentagon, heptagon, etc., which may be designed according to actual requirements, and the embodiments of the present disclosure do not specifically limit the specific shape, size or the like of the metal grid.

For example, one metal grid corresponds to one or more sub-pixels, and the orthographic projection of the one or more sub-pixels (e.g., display sub-pixels R, G, B) on the base substrate is in a region enclosed by the orthographic projection of the corresponding metal grid on the base substrate. For example, the mesh of the metal grid covers the one or more sub-pixels, for example, covers the pixel opening region of the one or more sub-pixels. For example, the orthographic projection of the metal lines of the metal grid on the base substrate is outside the orthographic projection of the pixel opening region of the corresponding one or more sub-pixels on the base substrate, that is, within a region enclosed by the orthographic projection of a pixel separation region between the pixel opening regions on the base substrate, and the pixel separation region may be, for example, a non-opening region of the pixel defining layer. The pixel separation region is configured to separate the pixel opening regions of a plurality of sub-pixels, so as to separate the light-emitting layers of the sub-pixels to prevent cross-color.

In some embodiments of the present disclosure, the material of the metal grid in the grid-like structure of the first touch control electrode 401 and the second touch control electrode 402 may include metal materials such as aluminum, molybdenum, copper, silver, or alloy materials of these metal materials, for example, silver-palladium-copper alloy (APC) material, etc.

For example, the material of the insulating layer 330 is an inorganic insulating material, for example, the inorganic insulating material is a transparent material. For example, the inorganic insulating material is an oxide of silicon, a nitride of silicon, or a nitrogen oxide of silicon such as silicon oxide, silicon nitride, and silicon oxynitride, or an insulating material including a metal nitrogen oxide such as aluminum oxide, titanium nitride, or the like. For example, the material of the insulating layer 330 may also be an organic insulating material to obtain good bending resistance. For example, the organic insulating material is a transparent material. For example, the organic insulating material is OCA optical glue. For example, the organic insulating material includes polyimide (PI), acrylate, epoxy, polymethyl methacrylate (PMMA), or the like.

It should be noted that, in some other embodiments, it is also possible that two adjacent second touch control sub-electrodes 420 in the first direction R31 are connected to each other through, for example, a bridge structure, which is in a conductive layer different from the second touch control sub-electrodes 420, while two adjacent first touch control sub-electrodes 410 in the second direction R32 are connected to each other through, for example, a connection electrode, which is in the same conductive layer and integrally formed with the first touch control sub-electrodes 410. That is, the above-mentioned electrical connection method used between two adjacent first touch control sub-electrodes 410 in the second direction R32 and the electrical connection method used between two adjacent second touch control sub-electrodes 420 in the first direction R31 are interchangeable with each other.

In some embodiments of the present disclosure, the first touch control electrode 401 and the second touch control electrode 402 are insulated from each other, the first touch control electrode 401 is the touch control driving electrode, and the second touch control electrode 402 is the touch control sensing electrode; alternatively, the first touch control electrode 401 is the touch control sensing electrode, and the second touch control electrode 402 is the touch control driving electrode, which are not limited in the embodiments of the present disclosure.

For example, in the case where the above-mentioned electronic substrate 10 is applied to, for example, a display panel or a display device, each first touch control electrode 401 and each second touch control electrode 402 are electrically connected to one first signal line 101 and one second signal line 102, respectively, and are connected to a touch control controller or a touch control integrated circuit through the first signal line 101 and the second signal line 102. Taking the first touch control electrode 401 as the touch control driving electrode and the second touch control electrode 402 as the touch control sensing electrode as an example, the touch control integrated circuit is, for example, a touch control chip, which is configured for providing the touch control driving signal to the first touch control electrode 401, receiving the touch control sensing signal from the second touch control electrode 402, and processing the received touch control sensing signal, for example, providing the processed data/signal to a system controller to implement the touch control sensing function. For example, the ends of the first signal line 101 and the second signal line 102 connected to the touch control integrated circuit are both arranged on the same side of the touch control region of the display panel to facilitate connection with the touch control integrated circuit; alternatively, one first signal line 101 is provided at each of both ends of one first touch control electrode 401, and the touch control integrated circuit can simultaneously input the touch control driving signal to the one first touch control electrode 401 bidirectionally through the two first signal lines 101 during operation (e.g., bilateral driving), so that the speed of signal loading on the first touch control electrode 401 is increased, and the detection speed is improved.

FIG. 12 is a schematic diagram of an example of a partial planar structure in the region RG4 shown in FIG. 2. It should be noted that, the arrangements of the first signal line 101, the second signal line 102 and other signal lines in the embodiment shown in FIG. 12 are basically the same as or similar to the arrangements in the embodiments shown in FIG. 3 and FIG. 4, the specific content may refer to the corresponding descriptions in the embodiments shown in FIG. 3 and FIG. 4, and repetitions or similarities will not be repeated.

For example, in the embodiment shown in FIG. 12, the first signal line 101 partially overlaps with the second signal line 102 in the overlapping region RC4, the line width of the first wiring portion 110 is smaller than the line width of the second wiring portion 120, and the extending direction R13 of the first wiring portion 110 and the extending direction R23 of the third wiring portion 130 are substantially perpendicular to each other.

For example, in the direction R23, the third signal line 103 is between the first signal line 101 and the second signal line 102 which are adjacent to each other, so as to facilitate reducing or avoiding possible signal interference between the first signal line 101 and the second signal line 102.

For example, the line width of the fourth wiring portion 140 in the second signal line 102 on a side close to the first functional region 11 is greater than the line width of the fourth wiring portion 140 in the second signal line 102 on a side away from the first functional region 11. Thus, it is beneficial to achieving the narrow frame design of the electronic substrate 10, and further reducing or avoiding adverse effects that may be caused to the second signal line 102 in the manufacturing process of the electronic substrate 10.

It should be noted that, in the embodiment shown in FIG. 12, the fifth signal line (not shown in FIG. 12) as described above may also be provided on the side of the first signal line 101, the second signal line 102, and the third signal line 103 away from the first functional region 11, so as to reduce or avoid adverse effects caused by the external environment or devices to which the first signal line 101, the second signal line 102, and the third signal line 103 may be subjected.

Figure 13C:
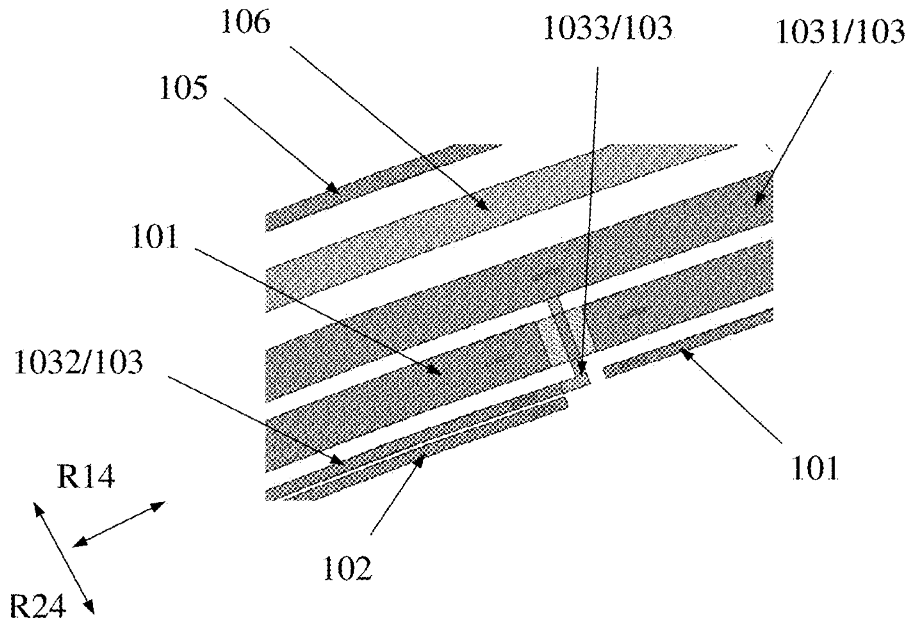

FIG. 13A to FIG. 13C are schematic diagrams of an example of a partial planar structure in the region RG5 shown in FIG. 2. For example, the regions shown in FIG. 13A to FIG. 13C respectively correspond to three regions in the region RG5 shown in FIG. 2 sequentially arranged in a direction close to the opening 12, that is, the region shown in FIG. 13A is on a side of the region shown in FIG. 13B away from the opening 12, and the region shown in FIG. 13B is on a side of the region shown in FIG. 13C away from the opening 12. For example, the regions shown in FIG. 13A to FIG. 13C may be three consecutive sub-regions in the region RG5 shown in FIG. 2.

For example, in the embodiments shown in FIG. 13A to FIG. 13C, in the direction R24, the fifth signal line 105 is on a side of the first signal line 101, the second signal line 102 and the third signal line 103 away from the first functional region 11, so as to facilitate reducing or avoiding the interference caused by the external environment or devices to which the first signal line 101, the second signal line 102, and the third signal line 103 may be subjected.

As illustrated in FIG. 13B, the first signal line 101 partially overlaps with the second signal line 102 in the overlapping region RCS, and the extending direction of the first wiring portion 110 and the extending direction of the third wiring portion 130 are substantially perpendicular to each other. For example, the extending direction R24 of a portion in the first wiring portion 110 overlapping with the third wiring portion 130 and the extending direction R14 of a portion in the third wiring portion 130 overlapping with the first wiring portion 110 are substantially perpendicular to each other. The line width of the first wiring portion 110 is smaller than the line width of the second wiring portion 120 in the first signal line 101 relatively on the side away from the first functional region 11, and the line width of the third wiring portion 130 is smaller than the line width of the fourth wiring portion 140 in the second signal line 102 relatively on the side away from the first functional region 11.

For example, the line width of the first wiring portion 110 is substantially equal to the line width of the second wiring portion 120 in the first signal line 101 relatively on the side close to the first functional region 11, and the width of the third wiring portion 130 is substantially equal to the line width of the fourth wiring portion 140 in the second signal line 102 relatively on the side close to the first functional region 11, thereby facilitating the realization of the narrow frame design of the electronic substrate 10.

For example, the line width of the fifth signal line 105 is relatively smaller than the line width of, for example, the third signal line 103 or the sixth signal line 106 on a side of the fifth signal line 105 close to the first functional region 11, thereby facilitating the realization of the narrow frame design of the electronic substrate 10.

For example, as illustrated in FIG. 13A and FIG. 13C, the third signal line 103 includes a sub-portion 1031 on the side of the second signal line 102 (or the first signal line 101) away from the first functional region 11, a sub-portion 1032 on the side of the second signal line 102 (or the first signal line 101) close to the first functional region 11, and a sub-portion 1033 partially overlapping with the second signal line 102 (or the first signal line 101).

For example, in the third signal line 103, the extending direction of the sub-portions 1031 and 1032 is the direction R14, and the extending direction of the sub-portion 1033 is the direction R24. For example, the extending direction R14 of the sub-portions 1031 and 1032 is substantially perpendicular to the extending direction R24 of the sub-portion 1033. The line width of the sub-portion 1031 is greater than the line width of the sub-portion 1032 and greater than the line width of the sub-portion 1033, and the line width of the sub-portion 1032 is substantially the same as the line width of the sub-portion 1033. Thus, the metal residue phenomenon caused by, for example, uneven etching or incomplete etching can be reduced or avoided, thereby avoiding the risk of short circuit, and it is also beneficial to achieving the narrow frame design of the electronic substrate 10.

It should be noted that, the specific arrangements of the first signal line 101, the second signal line 102, the third signal line 103 and other signal lines in the embodiments shown in FIG. 13A to FIG. 13C may refer to the corresponding descriptions in the embodiments shown in FIG. 3 and FIG. 4, and repetitions or similarities will not be repeated.

In some other embodiments of the present disclosure, it is possible that one of the first signal line 101 and the second signal line 102 is configured to transmit an electrical signal for the first functional region 11, and the other is configured to transmit an electrical signal for other regions (e.g., the peripheral region) except the first functional region 11, which are not specifically limited by the embodiments of the present disclosure.

At least one embodiment of the present disclosure further provides a display panel, and the display panel includes a display device and the electronic substrate according to any one of the embodiments of the present disclosure. In the display panel, the display device and the electronic substrate are stacked with each other. For example, the electronic substrate is configured to have a touch control function.

Figure 14:
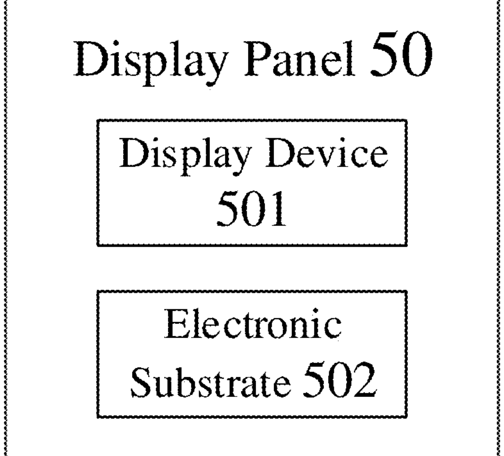
FIG. 14 is a schematic block diagram of a display panel provided by some embodiments of the present disclosure.

FIG. 14 is a schematic block diagram of a display panel provided by some embodiments of the present disclosure. For example, as illustrated in FIG. 14, the display panel 50 includes a display device 501 and an electronic substrate 502. For example, the display device 501 and the electronic substrate 502 are stacked with each other, for example, the electronic substrate 502 may be the electronic substrate according to any one of the embodiments of the present disclosure, such as the electronic substrate 10 or the electronic substrate 20 described above.

For example, in some embodiments of the present disclosure, the display panel 50 further includes an encapsulation layer between the display device 501 and the electronic substrate 502, thereby avoiding possible mutual interference between, for example, functional structures or film layers in the display device 501 and the electronic substrate 502.

Figure 15:
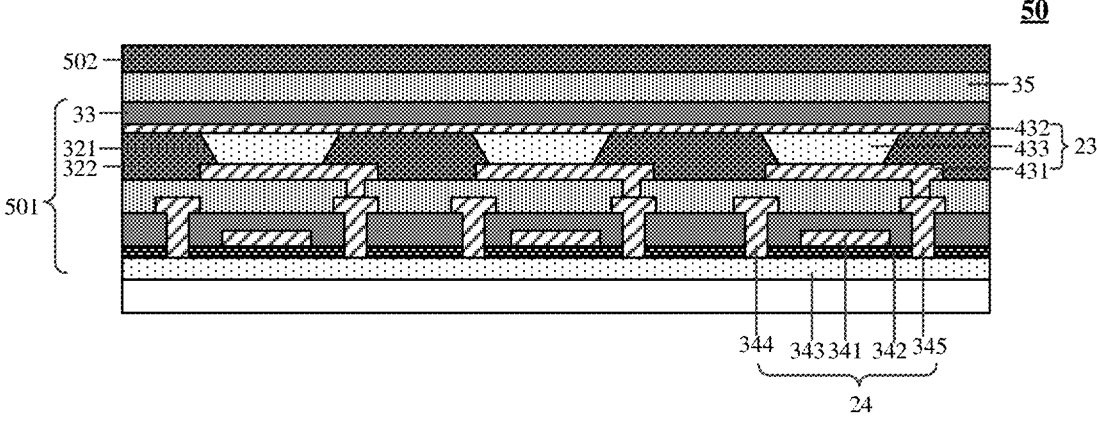
FIG. 15 is a schematic structural diagram of a specific example of a display panel provided by some embodiments of the present disclosure.

FIG. 15 is a schematic structural diagram of a specific example of a display panel 50 provided by some embodiments of the present disclosure.

As illustrated in FIG. 15, the electronic substrate 502 is on the display side of the display device 501, for example, on a side closer to the user during use.

For example, the embodiment here is described by taking the display panel as an OLED display panel as an example. For example, the OLED display panel may be an on-cell or in-cell touch control display panel. Of course, in some other embodiments, the display panel may also be a liquid crystal display panel, and the embodiments of the present disclosure do not limit the specific type of the display panel employing the electronic substrate provided by the embodiments of the present disclosure.

For example, the display device 501 includes a plurality of sub-pixels arranged in an array. For example, the display panel 50 is an OLED display panel, and the plurality of sub-pixels include a green sub-pixel, a red sub-pixel, a blue sub-pixel, or the like. Each sub-pixel includes a light-emitting element 23 and a pixel driving circuit that drives the light-emitting element 23 to emit light. The embodiments of the present disclosure do not limit the type and specific composition of the pixel driving circuit. For example, the pixel driving circuit may be of a current driving type or a voltage driving type, may be a 2T1C driving circuit (that is, two transistors and one capacitor, the two transistors including a driving transistor and a data writing transistor), or may be a driving circuit that further includes a compensation circuit (e.g., a compensation transistor), a light-emitting control circuit (e.g., a light-emitting control transistor), a reset circuit (e.g., a reset transistor), or the like on the basis of the 2T1C driving circuit.

For clarity, FIG. 15 shows a first transistor 24 in the pixel driving circuit that is directly electrically connected to the light-emitting element 23. The first transistor 24 may be a driving transistor configured to operate in a saturated state and control the magnitude of the current driving the light-emitting element 23 to emit light. For example, the first transistor 24 may also be a light-emitting control transistor for controlling whether the current for driving the light-emitting element 23 to emit light flows. The embodiments of the present disclosure do not limit the specific type of the first transistor 24.

For example, the light-emitting element 23 is an organic light-emitting diode, and includes a first electrode 431, a light-emitting layer 433, and a second electrode 432. One of the first electrode 431 and the second electrode 432 is an anode and the other is a cathode; for example, the first electrode 431 is an anode and the second electrode 432 is a cathode. For example, the light-emitting layer 433 is an organic light-emitting layer or a quantum dot light-emitting layer. For example, the light-emitting element 23 further includes auxiliary functional layers such as a hole injection layer, a hole transport layer, an electron injection layer, and an electron transport layer in addition to the light-emitting layer 433. For example, the light-emitting element 23 employs a top emission structure, and the first electrode 431 has reflectivity and the second electrode 432 has transmissivity or semi-transmissivity. For example, the first electrode 431 employs a high work function material to act as an anode, such as an ITO/Ag/ITO laminated structure; the second electrode 432 employs a low work function material to act as a cathode, for example, a semi-transmissive metal or metal alloy material, such as an Ag/Mg alloy material.

The first transistor 24 includes a gate electrode 341, a gate insulating layer 342, an active layer 343, a first electrode 344, and a second electrode 345, and the second electrode 345 is electrically connected to the first electrode 431 of the light-emitting element 23. The embodiments of the present disclosure do not limit the type, material, structure, or the like of the first transistor 24, for example, the first transistor 24 may be of a top-gate type, a bottom-gate type, or the like. For example, the active layer 343 of the first transistor 24 may be the amorphous silicon, polysilicon (low-temperature polysilicon and high-temperature polysilicon), oxide semiconductor (e.g., indium gallium tin oxide (IGZO)), or the like. For example, the first transistor 24 is an N-type transistor or a P-type transistor.

The transistors (e.g., the first transistor 24) adopted in the embodiments of the present disclosure may all be thin film transistors, field effect transistors, or other switching devices with the same characteristics. In the embodiments of the present disclosure, the thin film transistors are taken as examples for description. The source electrode and drain electrode of the transistor used here may be symmetrical in structure, so that the source electrode and the drain electrode may be structurally indistinguishable. In the embodiments of the present disclosure, in order to distinguish the two electrodes of the transistor except for the gate electrode, one electrode is directly described as the first electrode, and the other electrode is described as the second electrode.

As illustrated in FIG. 15, the display device 501 further includes a pixel defining layer 322 provided on the first electrode 431 of the light-emitting element 23, in which a plurality of openings 321 are formed to respectively expose the first electrodes of the plurality of sub-pixels 431, thereby defining a pixel opening region of each sub-pixel, the light-emitting layer of the sub-pixel is formed in the pixel opening region, and the second electrode 432 is formed as a common electrode (i.e., shared by a plurality of sub-pixels).

As illustrated in FIG. 15, the display device 501 further includes an encapsulation layer 33 between the light-emitting element 23 and the electronic substrate 502, and the encapsulation layer 33 is configured to seal the light-emitting element 23 to prevent external moisture and oxygen from penetrating into the light-emitting element 23 and the driving circuit to cause damage to devices such as the light-emitting element 23. For example, the encapsulation layer 33 is a single-layer structure or a multi-layer structure, for example, including an organic thin film, an inorganic thin film, or a multi-layer structure including the organic thin film and inorganic thin film stacked alternately.

For example, as illustrated in FIG. 15, the display panel 50 further includes a buffer layer 35 between the display device 501 and the electronic substrate 502. For example, the buffer layer 35 is formed on the encapsulation layer 33 for enhancing the adhesion between the electronic substrate 502 and the display device 501. For example, the buffer layer 35 is an inorganic insulating layer. For example, the material of the buffer layer 35 may be the silicon nitride, silicon oxide, nitrogen oxide of silicon, or the like. For example, the buffer layer 35 may also include a structure in which the silicon oxide layer and silicon nitride layer are alternately stacked.

For example, the display panel 50 provided by the embodiments of the present disclosure may have both the touch control function and the display function, and have all the technical effects of the electronic substrate provided by the above-mentioned embodiments of the present disclosure, which will not be repeated here.

At least one embodiment of the present disclosure further provides an electronic device, and the electronic device includes the electronic substrate according to any one of the embodiments of the present disclosure. For example, the electronic device includes the electronic substrate 10 or the electronic substrate 20 in the above-mentioned embodiments, and the electronic substrate is configured as a display substrate or a touch control substrate.

Figure 16:
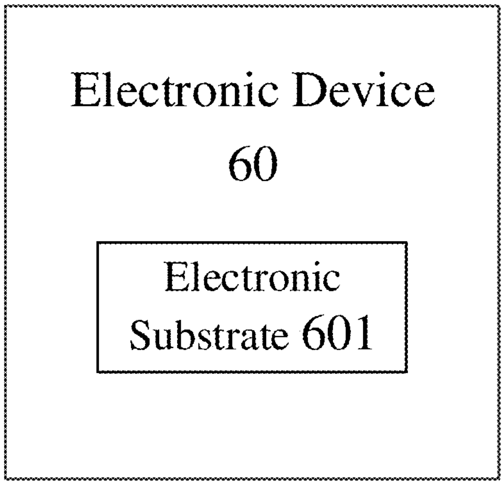
FIG. 16 is a schematic block diagram of an electronic device provided by some embodiments of the present disclosure.

FIG. 16 is a schematic block diagram of an electronic device provided by some embodiments of the present disclosure. For example, as illustrated in FIG. 16, the electronic device 60 includes an electronic substrate 601. For example, the electronic substrate 601 is the electronic substrate according to any one of the embodiments of the present disclosure, such as the electronic substrate 10 or the electronic substrate 20 in the above-mentioned embodiments.

For example, the electronic device 60 may be a touch control device or touch control equipment with a touch control function. For example, the electronic substrate 601 is used as an on-cell touch control substrate or an in-cell touch control substrate, or may also be other substrates with a touch control function. For example, the electronic device 60 may also be a display device or display equipment with a display function. For example, the electronic substrate 601 is a liquid crystal display (LCD) substrate, an organic light-emitting diode (OLED) display substrate, a quantum dot light-emitting diode (QLED) display substrate, an electronic paper display substrate, etc., or other substrates with a display function. For example, the electronic device 60 may also be a device or equipment with both a display function and a touch control function, or in addition to the display function and the touch control function, the electronic substrate 601 may further have other required functions according to different actual requirements, which are not specifically limited by the embodiments of the present disclosure.

The structure, function, and technical effects of the electronic device provided by the above-mentioned embodiments of the present disclosure may refer to the corresponding content of the electronic substrate or display panel provided by the above-mentioned embodiments of the present disclosure, which will not be repeated here.

For example, the electronic device provided by the embodiments of the present disclosure may be any product or component with the display function and/or touch control function, such as a display substrate, a display panel, a touch control substrate, a touch control panel, a touch control display substrate, a touch control display panel, an electronic paper, a mobile phone, a tablet computer, a television, a display, a notebook computer, a digital photo frame, a navigator, etc., and the embodiments of the present disclosure are not limited in this aspect.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should be understood that, in the case that a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto.

The protection scope of the present disclosure should be based on the protection scope of the claims.

What is claimed is:

1. An electronic substrate, comprising:

a base substrate; and at least one first signal line and at least one second signal line on the base substrate, wherein the electronic substrate comprises a first functional region and a peripheral region at least partially surrounding the first functional region, and the first signal line and the second signal line are in the peripheral region and at least partially surround the first functional region;

the first signal line and the second signal line are spaced apart from each other and insulated from each other;

at least one of the first signal line and the second signal line is configured to transmit an electrical signal for the first functional region;

in a direction perpendicular to the base substrate, the first signal line partially overlaps with the second signal line in an overlapping region; and the first signal line comprises a first wiring portion in the overlapping region and a second wiring portion outside the overlapping region, the second signal line comprises a third wiring portion in the overlapping region and a fourth wiring portion outside the overlapping region, wherein a line width of the first wiring portion is different from a line width of the second wiring portion, wherein the electronic substrate further comprises a first conductive layer, an insulating layer, and a second conductive layer, the first conductive layer, the insulating layer, and the second conductive layer are on the base substrate and are stacked with each other, the insulating layer is between the first conductive layer and the second conductive layer, and the first conductive layer and the second conductive layer are spaced apart and insulated from each other in the direction perpendicular to the base substrate by the insulating layer, the first wiring portion is in the first conductive layer, and the second wiring portion comprises a first sub-portion in the first conductive layer and a second sub-portion in the second conductive layer, and the first sub-portion of the second wiring portion is electrically connected to the second sub-portion of the second wiring portion through a via hole structure at least penetrating the insulating layer.

2. The electronic substrate according to claim 1, wherein a line width of a portion of the first wiring portion overlapping with the second signal line in the direction perpendicular to the base substrate is smaller than the line width of the second wiring portion.

3. The electronic substrate according to claim 1, wherein a line width of a portion of the first wiring portion not overlapping with the second signal line in the direction perpendicular to the base substrate is smaller than the line width of the second wiring portion.

4. The electronic substrate according to claim 1, wherein an average line width of the first wiring portion is smaller than an average line width of the second wiring portion.

5. The electronic substrate according to claim 1, wherein a line width of the third wiring portion is different from a line width of the fourth wiring portion.

6. The electronic substrate according to claim 5, wherein a line width of a portion of the third wiring portion overlapping with the first signal line in the direction perpendicular to the base substrate is smaller than the line width of the fourth wiring portion.

7. The electronic substrate according to claim 5, wherein a line width of a portion of the third wiring portion not overlapping with the first signal line in the direction perpendicular to the base substrate is smaller than the line width of the fourth wiring portion.

8. The electronic substrate according to claim 5, wherein an average line width of the third wiring portion is smaller than an average line width of the fourth wiring portion.

9. The electronic substrate according to claim 1, wherein an extending direction of an orthographic projection of the first wiring portion on the base substrate is substantially perpendicular to an extending direction of an orthographic projection of the third wiring portion on the base substrate.

10. The electronic substrate according to claim 1, wherein the second wiring portion and the fourth wiring portion are arranged side by side with each other in a plane parallel to the base substrate, and an extending direction of an orthographic projection of the second wiring portion on the base substrate is substantially parallel to an extending direction of an orthographic projection of the fourth wiring portion on the base substrate.

11. The electronic substrate according to claim 1, wherein an extending direction of an orthographic projection of the first wiring portion on the base substrate is substantially parallel to an extending direction of an orthographic projection of the second wiring portion on the base substrate, and the orthographic projection of the first wiring portion on the base substrate and the orthographic projection of the second wiring portion on the base substrate are substantially in one straight line.

12. The electronic substrate according to claim 1, wherein the third wiring portion is in the second conductive layer; and the fourth wiring portion comprises a first sub-portion in the first conductive layer and a second sub-portion in the second conductive layer, and the first sub-portion of the fourth wiring portion is electrically connected to the second sub-portion of the fourth wiring portion through a via hole structure at least penetrating the insulating layer.

13. The electronic substrate according to claim 1, wherein the at least one first signal line comprises a plurality of first signal lines, and the plurality of first signal lines are arranged side by side with each other in a plane parallel to the base substrate; and among the plurality of first signal lines, a distance between first wiring portions of two adjacent first signal lines is greater than a distance between second wiring portions of the two adjacent first signal lines.

14. The electronic substrate according to claim 13, wherein the plurality of first signal lines are sequentially arranged along a direction away from the first functional region; and among the plurality of first signal lines, via hole structures in the first signal lines for connecting the first sub-portion and the second sub-portion are staggered with each other in the direction away from the first functional region.

15. The electronic substrate according to claim 1, further comprising at least one third signal line on the base substrate, wherein the third signal line is in the peripheral region and at least partially surrounds the first functional region, and the third signal line is spaced apart and insulated from the first signal line and the second signal line, respectively;

in the direction perpendicular to the base substrate, the third signal line partially overlaps with the second signal line in the overlapping region;

the third signal line comprises a fifth wiring portion in the overlapping region and a sixth wiring portion outside the overlapping region;

the fifth wiring portion is in the first conductive layer; and the sixth wiring portion comprises a first sub-portion in the first conductive layer and a second sub-portion in the second conductive layer, and the first sub-portion of the sixth wiring portion is electrically connected to the second sub-portion of the sixth wiring portion through a via hole structure at least penetrating the insulating layer.

16. The electronic substrate according to claim 15, wherein the third signal line and the at least one first signal line are arranged side by side with each other in a plane parallel to the base substrate, and an extending direction of an orthographic projection of the third signal line on the base substrate is substantially parallel to an extending direction of an orthographic projection of the first signal line on the base substrate.

17. The electronic substrate according to claim 15, wherein a line width of the fifth wiring portion is different from a line width of the sixth wiring portion.

18. The electronic substrate according to claim 15, wherein the third signal line further comprises a seventh wiring portion in the overlapping region;

the seventh wiring portion is in the second conductive layer and is connected to the second sub-portion of the sixth wiring portion; and in the direction perpendicular to the base substrate, the seventh wiring portion partially overlaps with the first signal line in the overlapping region.

19. The electronic substrate according to claim 1, further comprising at least one fourth signal line on the base substrate, wherein the fourth signal line is in the peripheral region and at least partially surrounds the first functional region, and the fourth signal line is spaced apart and insulated from the first signal line and the second signal line, respectively;

in the direction perpendicular to the base substrate, the fourth signal line partially overlaps with the second signal line in the overlapping region; and the fourth signal line is on a side of the first signal line close to the first functional region, and a line width of the fourth signal line is smaller than or equal to the line width of the second wiring portion.

* * * * *